United States Patent [19]

Fukumoto

[11] Patent Number: 6,006,313

[45] Date of Patent: Dec. 21, 1999

[54] SEMICONDUCTOR MEMORY DEVICE THAT ALLOWS FOR RECONFIGURATION AROUND DEFECTIVE ZONES IN A MEMORY ARRAY

[75] Inventor: Katsumi Fukumoto, Nara, Japan

[73] Assignee: Sharp Kabushiki Kaisha, Osaka, Japan

[21] Appl. No.: 08/660,738

[22] Filed: Jun. 6, 1996

[30] Foreign Application Priority Data

Jun. 19, 1995 [JP] Japan ................................. 7-152013

[51] Int. Cl.[6] .......................... G06F 11/20; G11C 29/00
[52] U.S. Cl. ...................... 711/211; 711/170; 711/173; 711/103; 714/8; 714/702; 365/230.06; 365/200
[58] Field of Search .................................. 711/211, 202, 711/2, 1, 170–173, 212, 154, 103; 371/10.2, 2.2; 365/200, 230.06; 395/182.01, 182.06; 714/702, 8

[56] References Cited

U.S. PATENT DOCUMENTS

| | | | |
|---|---|---|---|
| 3,715,735 | 2/1973 | Moss | 365/200 |
| 3,781,826 | 12/1973 | Beausoleil | 714/8 |
| 3,796,996 | 3/1974 | Curley et al. | 711/157 |
| 4,028,539 | 6/1977 | Jacobs | 714/710 |
| 4,489,401 | 12/1984 | Smarandoiu | 365/200 |
| 4,633,429 | 12/1986 | Lewandowski | 365/200 |
| 4,868,789 | 9/1989 | MacDonald | 365/200 |
| 4,992,984 | 2/1991 | Bush | 365/200 |
| 5,053,990 | 10/1991 | Kreifels et al. | 711/103 |
| 5,058,071 | 10/1991 | Kohda | 365/200 |
| 5,249,158 | 9/1993 | Kynett et al. | 365/185.11 |
| 5,253,354 | 10/1993 | MacDonald et al. | 714/710 |
| 5,267,213 | 11/1993 | Sung et al. | 365/226 |
| 5,379,249 | 1/1995 | Salmon | 365/201 |
| 5,392,292 | 2/1995 | Davis et al. | 711/170 |
| 5,428,807 | 6/1995 | McKeen et al. | 395/392 |
| 5,491,809 | 2/1996 | Coffman | 711/103 |
| 5,539,697 | 7/1996 | Kim | 365/200 |
| 5,691,945 | 11/1997 | Liou | 365/200 |

FOREIGN PATENT DOCUMENTS 6-131879  5/1994  Japan .

*Primary Examiner*—Eddie P. Chan
*Assistant Examiner*—Yamir Encarnacion
*Attorney, Agent, or Firm*—Morrison & Foerster LLP

[57] ABSTRACT

An electrically rewritable nonvolatile semiconductor memory device made in accordance with a preferred embodiment of this invention, includes CAM data setting means for storing CAM data electrically written therein, wherein the CAM data is received from an external source; address fixing means for fixing a signal level of a portion of an internal address corresponding to an external address input from an external source based on the CAM data set in the CAM data setting means; and address switch means for switching a corresponding relationship between a portion of the external address input from an external source and a portion of the internal address based on the CAM data set in the CAM data setting means.

18 Claims, 23 Drawing Sheets

FIG. 4
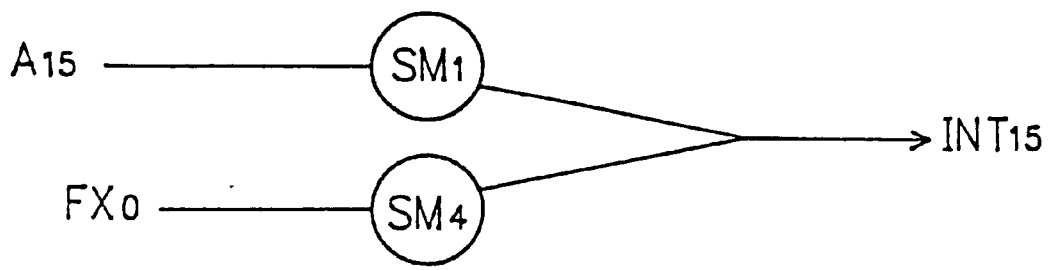
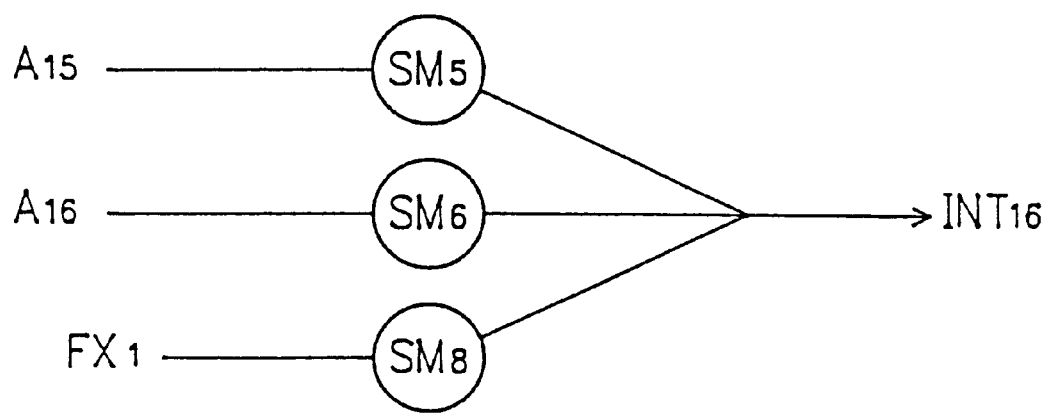
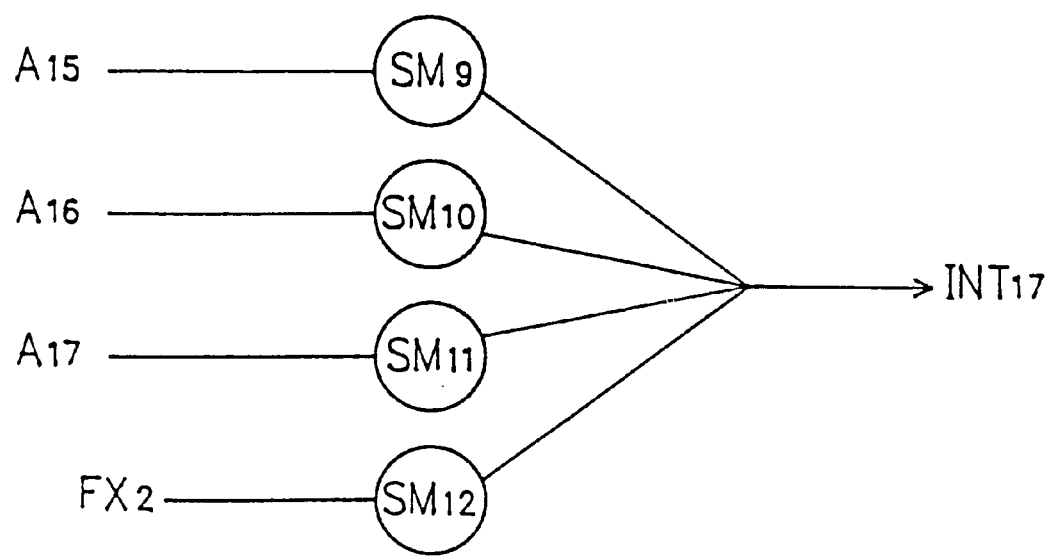

SEMICONDUCTOR MEMORY DEVICE THAT ALLOWS FOR RECONFIGURATION AROUND DEFECTIVE ZONES IN A MEMORY ARRAY

BACKGROUND OF THE INVENTION

1. Field of the Invention

The present invention relates to a semiconductor memory device which can be reused by skipping defective memory cells even if they are found therein.

2. Description of the Related Art

One type of conventional nonvolatile semiconductor memory device where data can be rewritten by the user is an erasable programmable read-only memory (EPROM) using cell transistors of a floating gate avalanche injection metal oxide semiconductor (FAMOS) structure and the like. In the EPROM, data can be written using a write device called a programmer (writer) and all data written in its memory cells can be erased at the same time by ultraviolet irradiation. The EPROM realizes a one transistor/one cell structure which reduces the area of one memory cell, allowing a larger amount of memory cells to be integrated in one chip, resulting in a large memory capacity and a low bit unit cost. However, the EPROM needs to use a ceramic package with expensive quartz glass for ultraviolet irradiation at the erase operation, preventing the chip unit cost from becoming even lower. Moreover, at the data write operation, a special write device is exclusively used. Chips must be mounted on a system via a socket to which chips are detachably attached. This attachment/detachment of chips at the write operation is troublesome, and the packaging cost increases.

One type of conventional electrically rewritable nonvolatile semiconductor memory device is an electrical EPROM (EEPROM) using cell transistors having a floating gate of a floating gate tunnel oxide (FLOTOX) structure which utilizes Fowler-Nordheim (FN) tunnel current and the like. The EEPROM is advantageous in that electrical data writing and erasure are possible while chips are kept mounted on a system. However, a selective transistor is required for each memory cell, increasing the area of one memory cell one and a half times to twice that of the EPROM. This increases the bit unit cost, which is disadvantageous for obtaining a large capacity.

A flash memory has conventionally been developed as a nonvolatile semiconductor memory device having the advantages of the EPROM and the EEPROM. As shown in FIG. 22, a memory cell of such a flash memory includes a cell transistor of a MOSFET (metal oxide semiconductor field effect transistor) structure and a floating gate 92 with an insulating gate oxide film residing underneath a control gate 91 of the cell transistor, as disclosed in U.S. Pat. No. 5,249,158, for example. This memory cell realizes the one transistor/one cell structure with no selective transistor. Thus, the bit unit cost is as low as that of the EPROM which is advantageous for obtaining a large capacity. Moreover, since electrical data writing and erasure are possible, an inexpensive plastic package can be used, eliminating the troublesome attachment/detachment of chips. Incidentally, data erasure is conducted for every chip unit or for every erase block unit when a chip is divided into a plurality of erase blocks.

When data is written in the cell transistor of the above flash memory, the control gate 91 is applied with a high voltage of about 12 V, a source 93 is grounded (0 V), and a drain 94 is applied with a voltage of about 7 V, simultaneously. Then, a large current flows between the drain 94 and the source 93, allowing high-energy hot electrons generated near the drain junction to be injected into the floating gate 92 and accumulated therein. Thus, the cell transistor with data written therein has a high threshold voltage with respect to the control gate 91, whereby data "1", for example, is stored. This method of injecting hot electrons into the floating gate 92 needs a large current of about 1 mA supplied to each cell transistor at the write operation. To overcome this problem, a modified type of flash memory has been developed where the current required at the write operation is reduced by injecting electrons by use of an FN tunnel current, as in the normal EEPROM.

When data is erased, the source 93 is applied with a high voltage of about 12 V and the control gate 91 is grounded simultaneously. Then, a high electric field is generated between the floating gate 92 and the source 93, allowing the electrons accumulated in the floating gate 92 to be drawn off therefrom via the thin gate oxide film by a tunnel current. This reduces the threshold voltage of the cell transistor, erasing the stored data. Since no selective transistor is included in the cell transistor of the flash memory, when an excessive amount of electrons are drawn off from the floating gate 92 (excessive erasure), the threshold voltage of the cell transistor becomes negative, allowing a leak current to flow. As a result, access to cell transistors on the same bit line is blocked, causing a decisive defect. At the data erase operation, therefore, measures for preventing the excessive erasure are required.

In the above erasing method, since the source 93 is applied with a high voltage as described above, the withstand voltage at the source junction must be kept high. This makes it difficult to minimize the size of the source electrode side. Moreover, some of the hot holes generated near the source junction are trapped in the gate oxide film, lowering the reliability of the cell transistor. To overcome these drawbacks, a modified erasing method has been developed where the source 93 is applied with a source voltage $V_{CC}$ (normally, about 5 V) and the control gate 91 is applied with a negative voltage of about −10 V, thus drawing off electrons accumulated in the floating gate 92 (negative gate erasing method). According to the negative gate erasing method, since the voltage applied to the source 93 is low, the withstand voltage at the source junction can be reduced, which allows the gate length of the cell transistor to be shortened. Moreover, in the former erasing method where a high voltage is applied to the source 93, the total tunnel current flowing between bands in the entire chip at the erase operation reaches several mA. A normal booster circuit with a small current supply capability is not enough to supply the high voltage, necessitating an external power source to supply a high voltage $V_{PP}$ for erasure. According to the negative gate erasing method, however, only a source voltage $V_{CC}$ (5 V or 3 V) is supplied to the source 93. Thus, it is comparatively easy to realize a flash memory having a single power source supplying only the source voltage $V_{CC}$.

When data is read, the source 93 is grounded (0 V), the drain 94 is applied with a low voltage of about 1 V, and the control gate 91 is applied with the source voltage $V_{CC}$ (normally, about 5 V) simultaneously. Then, when electrons have not been accumulated in the floating gate 92, the cell transistor is activated due to the low threshold voltage, allowing a drain current to flow between the drain 94 and the source 93. When data has been written and electrons have been accumulated in the floating gate 92, the cell transistor is kept disabled due to the high threshold voltage, allowing little drain current to flow between the drain 94 and the source 93. By detecting the level of the drain current, data "0" or "1" stored in the cell transistor can be read. The voltage to be applied to the drain 94 is as low as 1 V at the read operation so as to prevent parasitic weak write (soft write) from occurring due to application of a high voltage.

In the above cell transistor of the flash memory, writing is conducted on the drain junction side, while erasure is conducted on the source junction side. It is desirable therefore to optimize the profiles of these junctions in the device design according to the respective operations. More specifically, the drain junction side and the source junction side are made asymmetrical using a field concentration type profile for the drain junction to increase the write efficiency and a field relaxing type profile for the source junction to allow a high voltage to be applied at erasure.

Unlike RAMs (random access memories) and the like, the flash memory has many operation states such as block erase, chip batch erase, and read of state register, in addition to data write and read. Accordingly, in order to designate these operation states by combinations of control signals such as a chip enable signal CE bar and a write enable signal WE bar which are supplied externally, additional control signals other than conventional signals used in the EPROM and EEPROM must be defined and respective input terminals for these additional control signals are required. This makes the device less convenient. Practical flash memories therefore mainly employ a command method as disclosed in U.S. Pat. No. 5,053,990, where combinations of data and addresses, not combinations of control signals, are used as commands to designate the respective operation states. In such flash memories, types of commands input externally are identified by a command state machine (CSM) and a write state machine (WSM, an automatic erase/write control circuit) executes operations according to the commands.

Besides the EEPROM and the flash memory using a floating gate as described above, nonvolatile semiconductor memory devices using a ferroelectric thin film are also used. Two such nonvolatile semiconductor memory devices, one using the ferroelectric thin film as a ferroelectric disposed in a capacitor of a DRAM (dynamic RAM) and one using the ferroelectric thin film as a gate oxide film of a cell transistor, have been developed.

The above conventional nonvolatile semiconductor memory devices are fabricated in an extremely precise semiconductor process. Therefore, some percentage of memory cells may inevitably be found defective. However, if a semiconductor chip including a defective memory cell is discarded, the production yield is decreased. In DRAMs and SRAMs (static RAMs), a redundancy circuitry has been adopted where redundant memory cells are provided, in addition to main memory cells. When defective memory cells are detected, they can be replaced with redundant memory cells by laser trimming. With this method, the yield of the nonvolatile semiconductor memory device improves. Using a redundancy circuitry in the nonvolatile semiconductor memory device has also been proposed (for example, U.S. Pat. No. 5,267,213 and No. 5,379,249), where a content addressable memory (CAM) circuit having electrically writable nonvolatile memory cells is used in place of a fuse for switching by laser trimming and the like.

Referring to FIG. 23, the CAM circuit includes nonvolatile memory circuits in a quantity corresponding to a required amount of bits. Each nonvolatile memory circuit includes a pair of serial circuits each composed of a P-channel MOSFET 95, an N-channel MOSFET 96, and a cell transistor 97 of a flash memory and connected between a power source $V_{CC}$ and the ground. Each gate of the MOSFETs 95 is connected to each source of the opposing MOSFETs 95. Each gate of the MOSFETs 96 is applied with a bias voltage of a predetermined level, for example, about 2 V. As used herein, the terminal of a transistor from which a current flows when the transistor is in an ON state is referred to as the source, while the terminal of the transistor into which a current flows when the transistor is in the ON state is referred to as the drain, though these may be reversed.

One-bit CAM data can be stored in the cell transistors 97 in a nonvolatile manner as will now be described. In this CAM circuit, each control gate of the cell transistors 97 is applied with a high voltage $V_{PP}$ of 12 V, and each drain of the cell transistors 97 is applied with a complementary program voltage supplied from a CAM program circuit 98 so that one of the drains of the cell transistors 97 becomes 7 V (high level) and the other drain of the cell transistors 97 becomes 0 V (low level).

Reading of data from the cell transistors will be described. The CAM program circuit 98 applies a low voltage of 1 V or so to each drain of the cell transistors 97. Each control gate of the cell transistors 97 is applied with the source voltage $V_{CC}$. The source potential of one of the MOSFETs 95 becomes equal to either the source voltage $V_{CC}$ or the ground voltage depending on the memory content. This voltage can be read as 1-bit CAM data via an inverter 99. A switch circuit is controlled based on the thus-read CAM data to realize the switching between the main memory cell and the redundant memory cell.

In the nonvolatile semiconductor memory device using the above-described CAM circuit, if a memory having a memory capacity of 4M bits is fabricated, main memory cells in a quantity corresponding to 4M bits and redundant memory cells in an appropriate quantity are formed. When any defective memory cell is found at a test prior to packaging, CAM data corresponding to this defective memory cell is set in the CAM circuit, thereby replacing the defective memory cell with a redundant memory cell. Accordingly, after the replacement of the memory cell, the memory capacity of 4M bits is retained, and thus the resultant product can be considered the same as others where no defective memory cell is found.

An invention of switching the bit configuration and operation mode of a nonvolatile semiconductor memory device based on data stored in a nonvolatile memory cell, as in the CAM circuit, has been proposed (Japanese Laid-Open Patent Publication No. 6-131879).

An invention of changing the function of a read-only semiconductor memory device by use of a mask pattern used when data is written in a mask ROM has also been proposed (Japanese Laid-Open Patent Publication No. 2-63162).

The above conventional nonvolatile semiconductor device using the CAM circuit has a problem that will now be described. When no defective memory cell is found, the memory capacity for the redundant memory cells is wasted, increasing the production cost due to the enlarged circuit size for the redundant memory cells. Such redundancy circuitry is useful for early production lots where the defective rate is high. As the production is gradually stabilized or the production technique is improved, lowering the defective rate, the wasteful portion of the memory increases, which may become a factor of preventing cost reduction.

The inventions disclosed in Japanese Laid-Open Patent Publication No. 6-131879 and No. 2-63162 only relate to changes of the functions such as the bit configuration and operation mode of a semiconductor memory device, not responding to defective memory cells. The latter invention is only applicable to a mask ROM.

SUMMARY OF THE INVENTION

An electrically rewritable nonvolatile semiconductor memory device of this invention includes: CAM data setting means for storing CAM data electrically written therein, said CAM data being received from an external source; address fixing means for fixing a signal level of a portion of an internal address corresponding to an external address input from an external source based on the CAM data set in the CAM data setting means; and address switch means for switching a corresponding relationship between a portion of the external address input from an external source and a portion of the internal address based on the CAM data set in the CAM data setting means.

In one embodiment of the invention, the nonvolatile semiconductor memory device further includes signal fixing means for fixing a signal level of an internal signal corresponding to a portion of an external signal input from an external source based on the CAM data set in the CAM data setting means.

In another embodiment of the invention, the nonvolatile semiconductor memory device further includes signal switch means for switching a connection between at least a portion of output lines of input buffers for receiving external signals from an external source and at least a portion of internal signal lines based on the CAM data set in the CAM data setting means.

In still another embodiment of the invention, the nonvolatile semiconductor memory device further includes input buffer disabling means for disabling an input buffer for receiving a portion of an external signal input from an external source based on the CAM data set in the CAM data setting means.

In still another embodiment of the invention, the nonvolatile semiconductor memory device further includes: automatic erase/write control means for conducting erase verification using a count address counted by an address counter; and address counter changing means for fixing a signal level of a portion of digits of the address counter and connecting sequentially a more significant digit and a less significant digit of the portion of the digits of which signal level was fixed.

In still another embodiment of the invention, the nonvolatile semiconductor memory device further includes: automatic erase/write control means for conducting erase verification using a count address counted by an address counter; count address switch means for switching a corresponding relationship between a portion of a count value output from the address counter and a portion of the count address based on the CAM data set in the CAM data setting means; and initial value input means for inputting the external address input from outside into the address counter as an initial value of the count value.

In still another embodiment of the invention, the nonvolatile semiconductor memory device further includes: automatic erase/write control means for conducting erase verification using a count address counted by an address counter; count address switch means for switching a corresponding relationship between a portion of a count value output from the address counter and a portion of the count address based on the CAM data set in the CAM data setting means; and initial value input means for inputting the internal address into the address counter as an initial value of the count value by inverse transformation of the address switch means.

In still another embodiment of the invention, a memory cell array is divided into erase blocks of a fixed size, and the nonvolatile semiconductor memory device further comprises erase block size switch means for switching the size of the erase blocks based on the CAM data set in the CAM data setting means.

In still another embodiment of the invention, the nonvolatile semiconductor memory device further includes maximum address size switch means for switching a maximum address size of the address counter.

In still another embodiment of the invention, the nonvolatile semiconductor memory device further includes CAM data read means for reading the CAM data set in the CAM data setting means externally.

Alternatively, the semiconductor memory device of this invention includes: CAM data setting means for storing CAM data written therein from an external source; address fixing means for fixing a signal level of a portion of an internal address corresponding to an external address input from an external source based on the CAM data set in the CAM data setting means; and address switch means for switching a corresponding relationship between a portion of the external address input from an external source and a portion of the internal address based on the CAM data set in the CAM data setting means.

In one embodiment of the invention, the semiconductor memory device further includes signal fixing means for fixing a signal level of an internal signal corresponding to a portion of an external signal input from an external source based on the CAM data set in the CAM data setting means.

In another embodiment of the invention, the semiconductor memory device further includes signal switch means for switching a connection between at least a portion of output lines of input buffers for receiving external signals from an external and at least a portion of internal signal lines based on the CAM data set in the CAM data setting means.

In still another embodiment of the invention, the semiconductor memory device further includes input buffer disabling means for disabling an input buffer for receiving a portion of an external signal input from an external source based on the CAM data set in the CAM data setting means.

In still another embodiment of the invention, the semiconductor memory device further includes CAM data read means for reading the CAM data set in the CAM data setting means externally.

Thus, with the above configuration, when the address fixing means fixes the signal levels of N bits among the bits of the internal address corresponding to the external address, only a region corresponding to $\frac{1}{2}^N$ of the total memory cells is accessible while the remaining region is invalidated. Accordingly, if defective memory cells are found, by selecting bits of the internal address so that all the defective memory cells are included in the region to be invalidated and fixing the signal levels of these bits at the final stage of the semiconductor fabrication process, the nonvolatile semiconductor memory device having defective memory cells can be recovered as a good memory device composed of only normal memory cells, though the memory capacity decreases to $\frac{1}{2}^N$.

However, excluding the case where the bit(s) to be fixed is one or more bit(s) sequential from the most significant bit, unless the bit(s) of the external address corresponding to the fixed bit(s) is made to correspond to the bit(s) of the internal address which originally corresponds to more significant bit(s) of the external address, the external address becomes discontinuous. To overcome this problem, the corresponding relationship between the external address and the internal address is switched by the address switching means. With this operation, the nonvolatile semiconductor memory device with the memory capacity reduced to $\frac{1}{2}^N$ can be accessed by sequential external address.

The CAM data setting means determines the region to be invalidated by electrically writing externally received CAM data generally at the final stage of the semiconductor fabrication process. If the CAM data is rewritable, the setting can be changed. The CAM data can be stored in the nonvolatile manner in memory cells having a configuration similar to that of memory cells of a nonvolatile semiconductor memory device.

The signal fixing means may fix the signal level of an internal signal corresponding to a signal other than an address signal input from outside. Then, the bit configuration, the operation mode, and the like of the nonvolatile semiconductor memory device can be fixed to values which can be changed by the signal. Thus, it is possible to change the type of the product immediately before packaging, for example.

The signal fixing means is the same as the address fixing means when the internal address corresponding to the external address is fixed. Therefore, these means can be integrated.

The arrangement of electrode pads on the semiconductor chip can be changed by switching the connection between the output line of the input buffer and the internal signal line by the signal switch means. This makes it possible to package the semiconductor chip into many types of packages with different pin arrangements. No change in the wire bonding step and the like is required.

The signal switch means is the same as the address switch means when the corresponding relationship between the external address and the internal address is switched. Therefore, these means can be integrated.

The input buffer disabling means may disable an input buffer for receiving the external signal which has been invalidated due to the fixing of the corresponding internal signal by the address fixing means and the signal fixing means. Then, wasteful power consumption by the input buffer can be saved. Further, in the case where a plurality of electrode pads corresponding to a same internal signal are arranged at different positions on the semiconductor chip, these electrode pads may not be connected with one another by metal wirings and the like. Instead, only electrode pads required for packaging may be connected by the signal switch means, cutting off the remaining electrode pads to disable corresponding input buffers. This avoids an increase of the input capacity due to unnecessary input buffers.

The address counter changing means may fix the signal levels of some of the digits of the address counter and sequence the remaining digits. Then, the count address of the address counter can be changed as in the change of the internal address by the address fixing means and the address switch means.

In the case of the nonvolatile semiconductor memory device having a function of erase verification by the address counter, when the corresponding relationship between the external address and the internal address is changed by the address switch means, the corresponding relationship between the counter address of the address counter and the internal address is changed, preventing correct execution of the erase verification. However, by changing the configuration of the address counter by the address counter changing means so as to obtain the correct corresponding relationship between the counter address and the internal address, the present invention is applicable to the nonvolatile semiconductor memory device provided with the automatic erase/write control means which conducts the erase verification.

The count address changing means may change the count value of the address counter as in the address fixing means and the address switch means. Then, the erase verification can be correctly executed without changing the configuration of the address counter itself. In this case, since the internal address cannot be input as the initial count value of the address counter, the initial value input means inputs the external address before being converted by the address fixing means and the address switch means.

The initial value input means may input the internal address into the address counter as the initial count value by inverse transformation of the address switch means.

The erase block size switch means may switch the size of the erase block at the final stage of the semiconductor fabrication process.

When the memory capacity of the nonvolatile semiconductor memory device decreases, the maximum address size switch means can reduce the maximum address size of the address counter.

The CAM data read means may read the CAM data set in the CAM data setting means externally. Then, the content of the change of the configuration of the nonvolatile semiconductor memory device can be obtained even after the CAM data is written, facilitating the administration of the fabrication process.

Thus, according to the nonvolatile semiconductor memory device of the present invention, part of the memory cells can be invalidated by writing CAM data in the CAM data setting means at the final state of the semiconductor fabrication process. Thus, a semiconductor chip including a defective memory cell can be recovered as a good product. Also, by setting the CAM data, one product can be easily changed to a product with a different function or a different package. By disabling an unnecessary input buffer, wasteful power consumption can be saved.

In the case of the nonvolatile semiconductor memory device provided with the automatic erase/write control means where the erase verification is conducted by the address counter, the count address of the address counter can be changed in correspondence with the change of the corresponding relationship between the external address and the internal address.

Since the set CAM data can be easily read, the administration of the fabrication process is facilitated.

Thus, the invention described herein makes possible the advantage of providing a nonvolatile semiconductor memory device where a portion of a memory including a defective memory cell is invalidated by setting CAM data at the final stage of a semiconductor fabrication process, for example, to recover the memory device as a good product.

Conventional semiconductor memory devices, especially DRAMs, have been replaced with a new generation of semiconductor memory devices in a cycle of three to four years. For example, in the period where 4M-bit memory devices were available as the mainstream, 2M-bit or 1M-bit products with smaller memory capacities had been considered extremely low in the product value as old-generation products. For this reason, a memory recovered as a 2M-bit or 1M-bit product by skipping defective memory cells of an original 4M-bit product had no way to be effectively used. It was rather troublesome to administer products with a reduced memory capacity separately from others in the fabrication process. In recent years, however, as the memory capacity of semiconductor memory devices has increased on a large scale, the demand for older-generation products has comparatively increased. Thus, a product with a reduced memory capacity recovered by skipping a portion including defective memory cells can be effectively used. This recovery use of a semiconductor chip which would otherwise have been discarded is advantageous in the aspect of cost.

These and other advantages of the present invention will become apparent to those skilled in the art upon reading and understanding the following detailed description with reference to the accompanying figures.

BRIEF DESCRIPTION OF THE DRAWINGS

FIG. 4 shows a concept of the function of an address switch circuit in Example 1.

DESCRIPTION OF THE PREFERRED EMBODIMENTS

Example 1

Hereinbelow, a nonvolatile semiconductor memory device such as a nonvolatile RAM or EPROM without an automatic erase/write control circuit will be described as the first example of the present invention with reference to FIGS. 1 to 15. The nonvolatile semiconductor memory device has a memory capacity of 4M bits where the 8-bit configuration and the 16-bit configuration can be switched therebetween in response to a byte signal BYTE bar. For example, in the 8-bit configuration, an external address of 19 bits $A_{17\ to\ A_{-1}}$ is used for accessing ($2^{19} \times 8$ bits=4M bits), while in the 16-bit configuration, an external address of 18 bits $A_{17\ to\ A0}$ is used for accessing ($2^{18} \times 16$ bits=4M bits).

Figure 1:
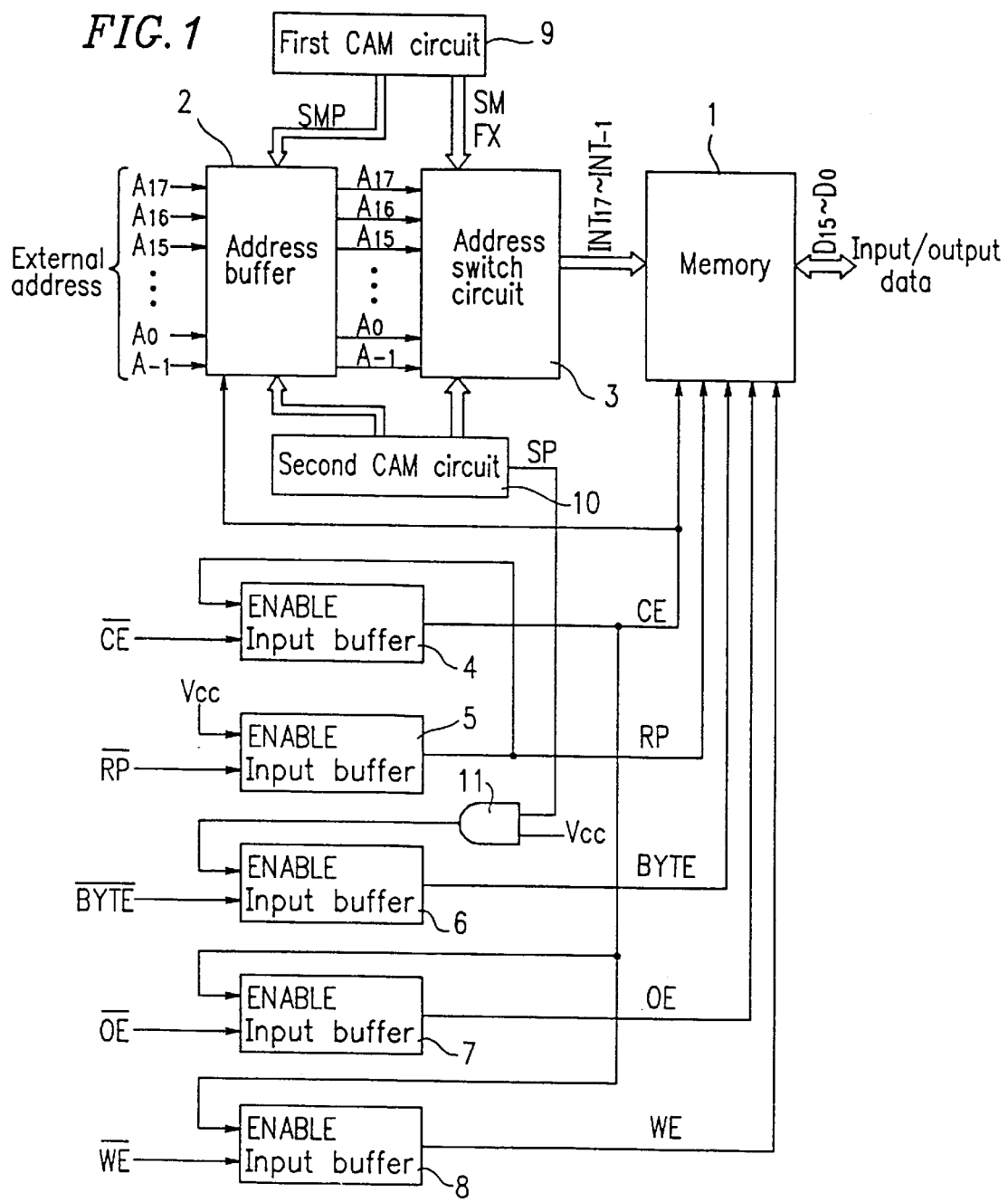
FIG. 1 is a block diagram showing the configuration of a nonvolatile semiconductor memory device of Example 1 according to the present invention.

Referring to FIG. 1, the nonvolatile semiconductor memory device of this example includes a memory 1 having a 4M-bit memory cell array, row and column decoders, and a sense amplifier. In the 8-bit configuration, data $D_0$ to $D_7$ are simultaneously input into and output from eight memory cells of the memory 1. In the 16-bit configuration, data $D_0$ to $D_{15}$ are simultaneously input into and output from 16 memory cells of the memory 1. The external address bits $A_{17}$ to $A_{-1}$ for designating these memory cells are input into an address switch circuit 3 via an address buffer 2, and converted into internal address bits $INT_{17}$ to $INT_{-1}$ by the address switch circuit 3 to be sent to the memory 1. A chip enable signal CE bar, a reset signal RP bar, the byte signal BYTE bar, an output enable signal OE bar, and a write enable signal WE bar are input into the memory 1 via respective input buffers 4 to 8 as control signals.

The chip enable signal CE bar is used to indicate which memory is to be used when a plurality of memories are available. For example, when the chip enable signal CE bar is input, a corresponding memory becomes accessible. The reset signal RP bar is used to reset data stored in a memory. For example, when the reset signal RP bar is input, data stored in the memory is cleared. The output enable signal OE bar is used to allow data stored in a memory to be output. The write enable signal WE bar is used to allow data to be stored in a memory.

Figure 23:
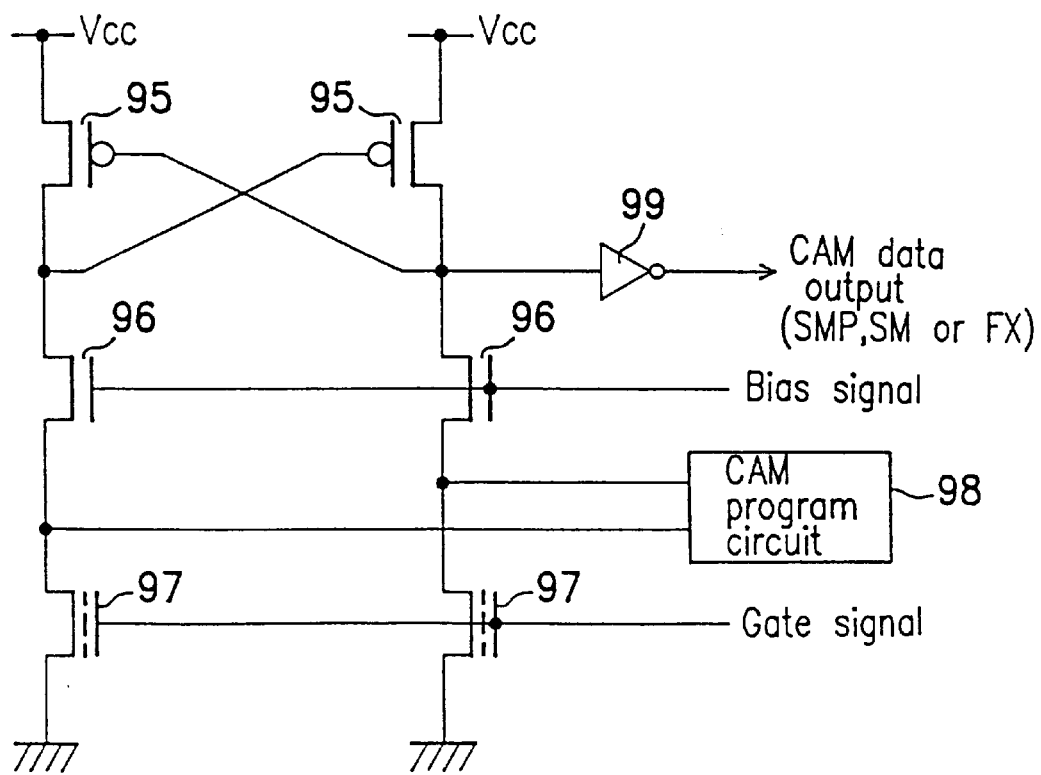
FIG. 23 is a block diagram of a conventional CAM circuit.

The above nonvolatile semiconductor memory device also includes a first CAM circuit 9 and a second CAM circuit 10. Each of the CAM circuits 9 and 10 is composed of nonvolatile memory circuits as shown in FIG. 23 in a quantity corresponding to a required amount of bits. In the CAM circuits 9 and 10, any CAM data can be set by external electrical writing from an external source, and the once-set CAM data can be changed a desired number of times. The CAM circuits 9 and 10 send CAM control signals to the address switch circuit 3 based on the set CAM data, so as to fix the signal level of some of the internal address bits $INT_{17}$ to $INT_{-1}$ or switch the corresponding relationship between the external address bits $A_{17\ to\ A_{-1}}$ and the internal address bits $INT_{17}$ to $INT_{-1}$. The CAM circuits 9 and 10 also send CAM control signals to the address buffer 2 based on the set CAM data, so as to render some of the input buffers for receiving the external address bits $A_{17}$ to $A_{-1}$ to a disabled state.

Hereinbelow, the first and second CAM circuits 9 and 10 will be described in more detail. The first CAM circuit 9 invalidates a region of the memory 1 including a defective memory cell, using the three most significant bits ($A_{17}$, $A_{16}$, $A_{15}$) of the external address bits $A_{17}$ to $A_{-1}$. The memory capacity of 4M bits is reduced to 2M bits or 1M bits depending on the setting of the CAM data. The term "invalidating a memory cell" as used herein means that all operations of reading or writing data from or in the defective memory cell are inhibited. The CAM data to be set in the first CAM circuit 9 is composed of a total of six bits; CAM data of three bits $US_0$ to $US_2$ and CAM data of three bits $FX_0$ to $FX_2$.

TABLE 1

| Capacity | CAM data | $US_0$ | $US_1$ | $US_2$ | $FX_0$ | $FX_1$ | $FX_2$ |
|---|---|---|---|---|---|---|---|
| 4M | predetermined value | 0 | 0 | 0 | — | — | — |
| 2M | (1) | 0 | 0 | 1 | — | — | 0/1 |
|  | (2) | 0 | 1 | 0 | — | 0/1 | — |
|  | (3) | 1 | 0 | 0 | 0/1 | — | — |
| 1M | (4) | 0 | 1 | 1 | — | 0/1 | 0/1 |
|  | (5) | 1 | 0 | 1 | 0/1 | — | 0/1 |
|  | (6) | 1 | 1 | 0 | 0/1 | 0/1 | — |

When no CAM data setting is conducted (when a predetermined value is used), all the values of the CAM data $US_0$ to $US_2$ are "0", allowing the main memory capacity of 4M bits to be retained. When one of three patterns (1) to (3) shown in Table 1 is set, one of the values of the CAM data $US_0$ to $US_2$ is "1", resulting in halving the memory capacity to 2M bits as described later in detail. When one of three patterns (4) to (6) shown in Table 1 is set, two of the values of the CAM data $US_0$ to $US_2$ are "1", resulting in quartering the memory capacity to 1M bits as described later in detail. The CAM data $FX_0$ to $FX_2$ of six patterns (1) to (6) are set at "0" or "1" where necessary as described later in detail.

Figure 2:
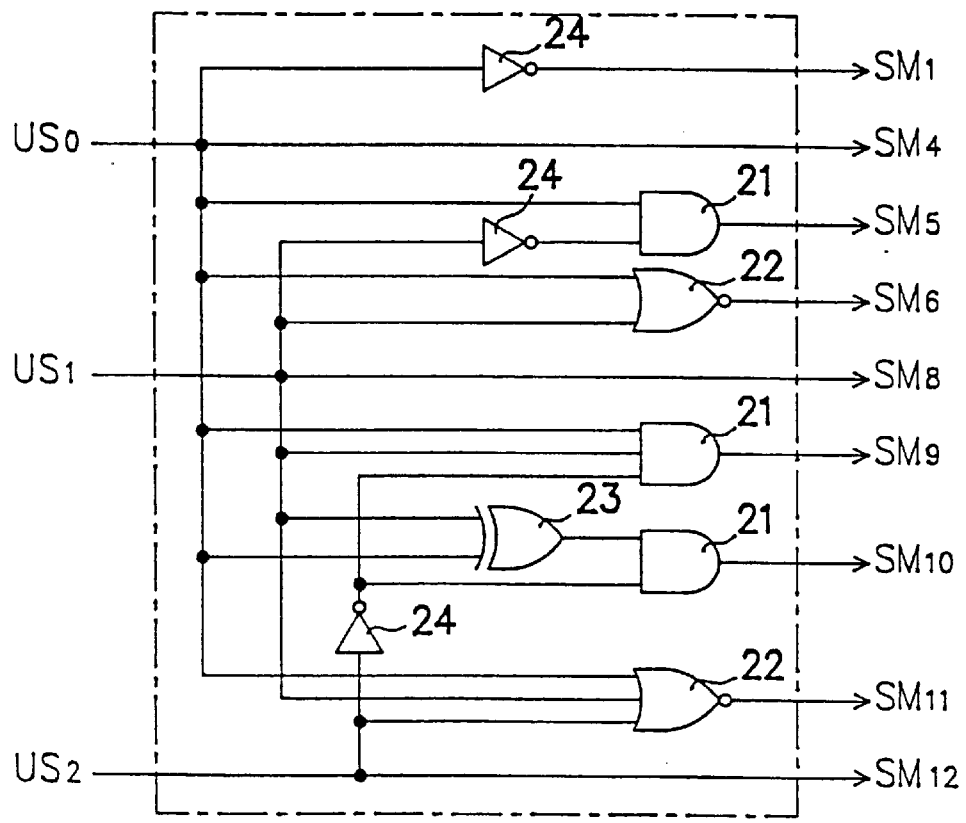
FIG. 2 is a block diagram of a logic circuit of a first CAM circuit for generating a CAM control signal SM in Example 1.

The first CAM circuit 9 generates a CAM control signal of nine bits $SM_1$ and $SM_4$ to $SM_{12}$ and a CAM control signal of two bits $SMP_1$ and $SMP_2$ based on the CAM data $US_0$ to $US_2$ by use of its internal logic circuit. The CAM control signal bits $SM_1$ to $SM_{12}$ are sent to the address switch circuit 3, while the CAM control signal bits $SMP_1$ and $SMP_2$ are sent to the address buffer 2. The first CAM circuit 9 also sends the CAM data $FX_0$ to $FX_2$ to the address switch circuit 3 as a CAM control signal of three bits $FX_0$ to $FX_2$ without any processing. The CAM control signal bits $FX_0$ to $FX_2$ indicate a fixed portion of the address. The logic circuit for generating the CAM control signal bits $SM_1$ and $SM_4$ to $SM_{12}$ is shown in FIG. 2, which includes AND circuits 21, NOR circuits 22, an exclusive OR (EX-OR) circuit 23, and NOT circuits 24. By passing through the logic circuit, the CAM data $US_0$ to $US_2$ are converted into the nine CAM control signal bits $SM_1$ and $SM_4$ to $SM_{12}$ as shown in a truth table of Table 2 below.

TABLE 2

| $US_0$ | $US_1$ | $US_2$ | $SM_1$ | $SM_4$ | $SM_5$ | $SM_6$ | $SM_8$ | $SM_9$ | $SM_{10}$ | $SM_{11}$ | $SM_{12}$ |
|---|---|---|---|---|---|---|---|---|---|---|---|
| 0 | 0 | 0 | 1 | 0 | 0 | 1 | 0 | 0 | 0 | 1 | 0 |
| 0 | 0 | 1 | 1 | 0 | 0 | 1 | 0 | 0 | 0 | 0 | 1 |
| 0 | 1 | 0 | 1 | 0 | 0 | 0 | 1 | 0 | 1 | 0 | 0 |
| 1 | 0 | 0 | 0 | 1 | 1 | 0 | 0 | 0 | 1 | 0 | 0 |
| 0 | 1 | 1 | 1 | 0 | 0 | 0 | 1 | 0 | 0 | 0 | 1 |
| 1 | 0 | 1 | 0 | 1 | 1 | 0 | 0 | 0 | 0 | 0 | 1 |
| 1 | 1 | 0 | 0 | 0 | 1 | 0 | 0 | 1 | 1 | 0 | 0 |

Figure 3:
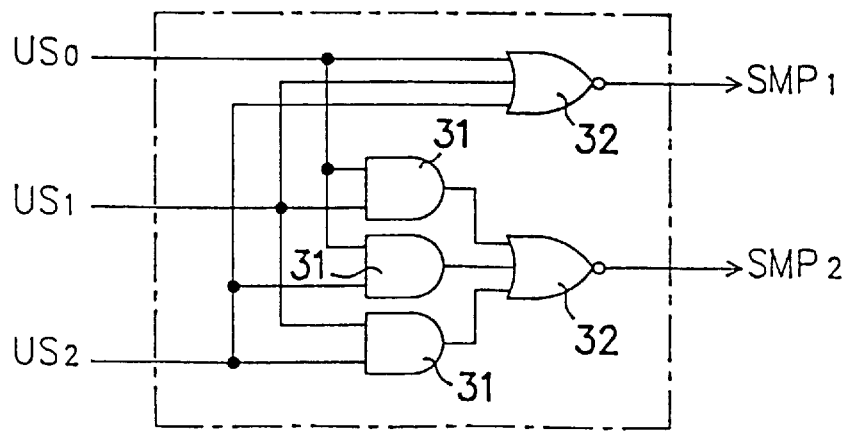
FIG. 3 is a block diagram of a logic circuit of a first CAM circuit for generating a CAM control signal SMP in Example 1.

A logic circuit for generating the CAM control signal bits $SMP_1$ and $SMP_2$ is shown in FIG. 3, which includes AND circuits 31 and NOR circuits 32. By passing through the logic circuit, the CAM data $US_0$ to $US_2$ are converted into the two CAM control signal bits $SMP_1$ and $SMP_2$ as shown in a truth table of Table 3 below.

TABLE 3

| $US_0$ | $US_1$ | $US_2$ | $SMP_1$ | $SMP_2$ |
|---|---|---|---|---|
| 0 | 0 | 0 | 1 | 1 |
| 0 | 0 | 1 | 0 | 1 |
| 0 | 1 | 0 | 0 | 1 |
| 1 | 0 | 0 | 0 | 1 |
| 0 | 1 | 1 | 0 | 0 |
| 1 | 0 | 1 | 0 | 0 |
| 1 | 1 | 0 | 0 | 0 |

As shown in FIG. 4, the address switch circuit 3 shown in FIG. 1 switches the corresponding relationship between the three most significant bits ($A_{17}$ to $A_{15}$) of the external address bits $A_{17}$ to $A_{-1}$ input thereinto through the address buffer 2 and the three most significant bits ($INT_{17}$ to $INT_{15}$) of the internal address bits $INT_{17}$ to $INT_{-1}$ based on the CAM control signal bits $SM_1$ and $SM_4$ to $SM_{12}$ and the CAM control signal bits $FX_0$ to $FX_2$ sent from the first CAM circuit 9.

FIG. 4 shows a portion of the address switch circuit 3. The address switch circuit 3 selects signal bits among the external address bits $A_{17\ to\ A15}$ and the CAM control signal bits $FX_0$ to $FX_2$ based on the CAM control signal bits $SM_1$ and $SM_4$ to $SM_{12}$. The selected signal bits are output as the internal address bits $INT_{17}$ to $INT_{15}$. For example, the CAM control signal bit $SM_1$ is "1", the external address bit $A_{15}$ is output as the internal address bit $INT_{15}$.

Figure 5:
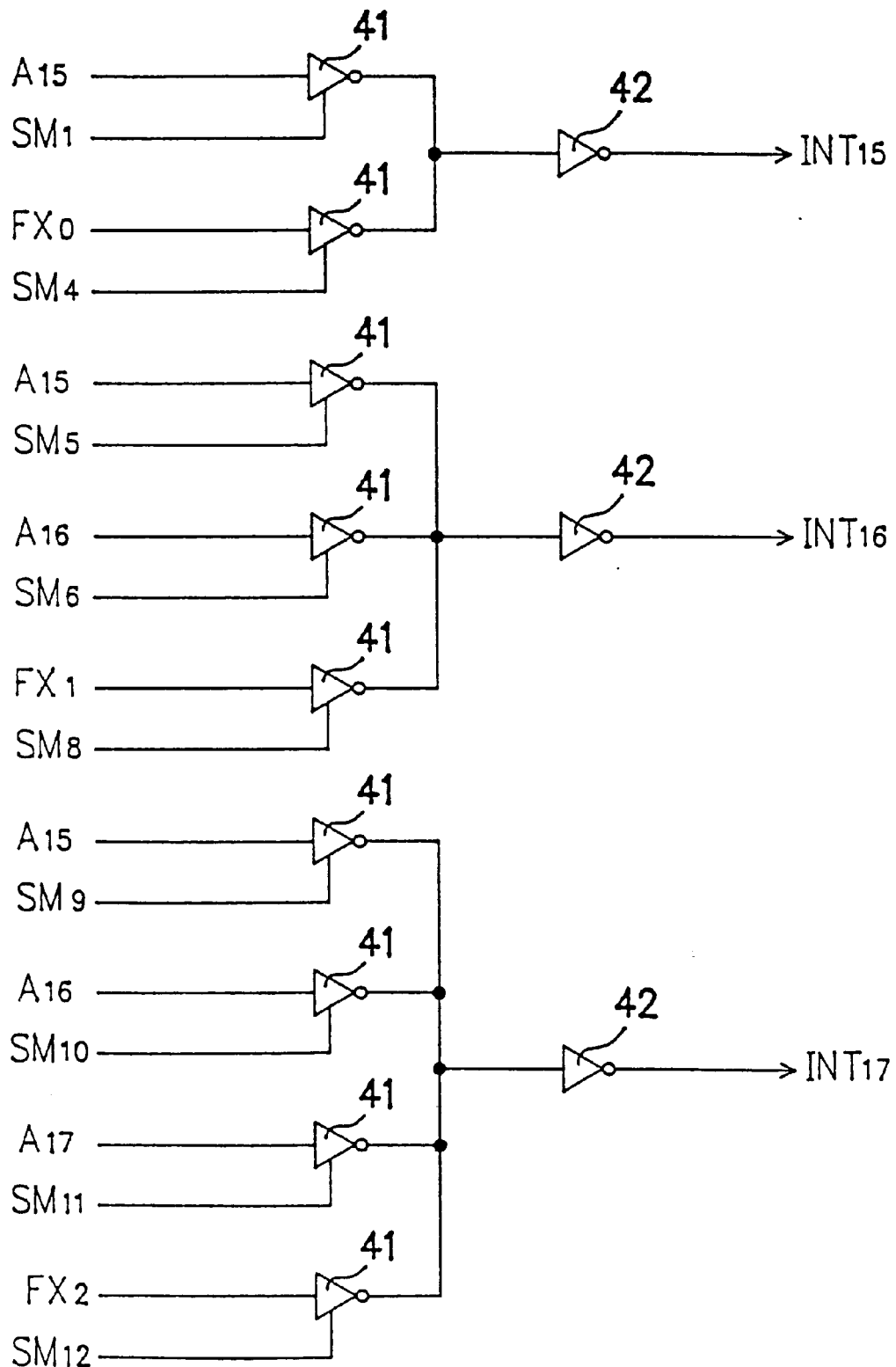
FIG. 5 is a block diagram showing the configuration of the address switch circuit in Example 1.

FIG. 5 shows a portion of the address switch circuit 3 in more detail. The external address bits $A_{17}$ to $A_{15}$ or the CAM control signal bits $FX_0$ to $FX_2$ are input into input terminals of respective 3-status buffers 41. The CAM control signal bits $SM_1$ and $SM_4$ to $SM_{12}$ are input into control terminals of the respective 3-status buffers 41. Each of the 3-status buffers 41 outputs an inverted value of an input signal when the input at the control terminal is in H level ("1"), and puts the output in a high-impedance state when the input at the control terminal is in L level ("0").

With the above configuration, when the CAM data in the first CAM circuit 9 is a predetermined value without any setting, only the values of the CAM control signal bits $SM_1$, $SM_6$, and $SM_{11}$ are "1" from Tables 1 and 2. Thus, as shown in FIGS. 4 and 5, the external address bits $A_{17}$ to $A_{15}$ are output as the corresponding internal address bits $INT_{17}$ to $INT_{15}$. The external address bits $A_{17}$ to $A_{-1}$ are output as the internal address bits $INT_{17}$ to $INT_{-1}$, respectively, without any change, and thus all the memory cells of 4M bits are accessible by the 19-bit or 18-bit address.

Figure 6:
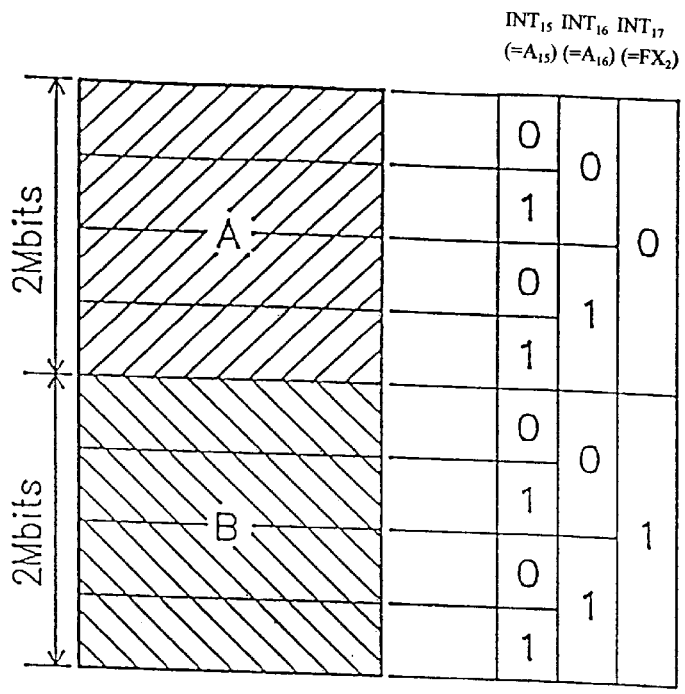
FIG. 6 is a first memory map of the nonvolatile semiconductor memory device of Example 1 when only 2M bits are available.

When the CAM data of pattern (1) shown in Table 1 is set in the first CAM circuit 9, only the values of the CAM control signal bits $SM_1$, $SM_6$, and $SM_{12}$ are "1" as shown in Table 2. Thus, as shown in FIGS. 4 and 5, the external address bits $A_{16}$ and $A_{15}$ are output as the corresponding internal address bits $INT_{16}$ and $INT_{15}$, while the CAM control signal bit $FX_2$ is output as the internal address bit $INT_{17}$. In this case, therefore, the most significant external address bit $A_{17}$ is invalidated. Thus, the number of bits of the address available for accessing to the memory cells is decreased by one bit. The accessible memory capacity is therefore reduced to 2M bits. Further, as shown in FIG. 6, when the value of the CAM control signal bit $FX_2$ is "0", only a region A covering less significant 2M bits is effective among the entire memory region of 4M bits. When the value of the CAM control signal bit $FX_2$ is "1", only a region B covering more significant 2M bits is effective. If defective memory cells exist only in either the region A or the region B, the value of the CAM control signal bit $FX_2$ can be set so that the region A or B having no defective memory cell is made effective. With this setting, a nonvolatile semiconductor memory device having defective memory cells can be recovered as a good nonvolatile memory device composed of only normal memory cells though the memory capacity thereof is halved.

Figure 7:
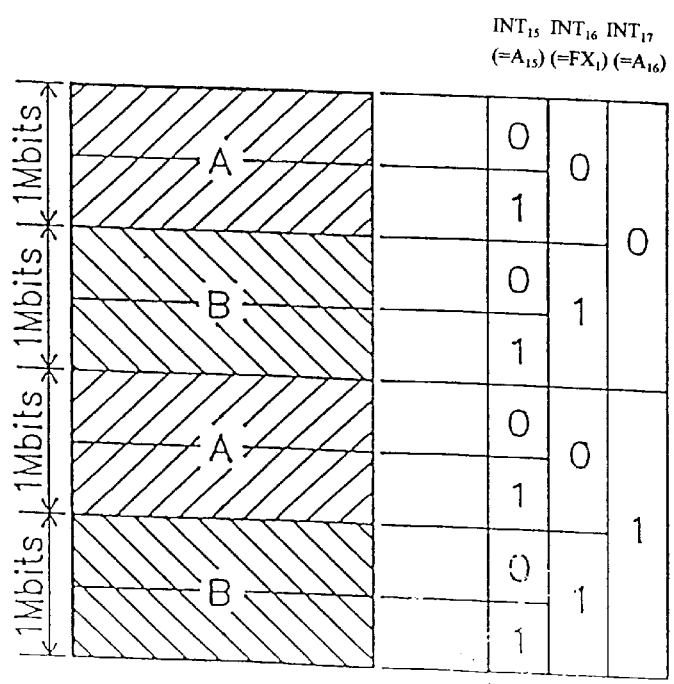
FIG. 7 is a second memory map of the nonvolatile semiconductor memory device of Example 1 when only 2M bits are available.

When the CAM data of pattern (2) shown in Table 1 is set in the first CAM circuit 9, only the values of the CAM control signal bits $SM_1$, $SM_8$, and $SM_{10}$ are "1" as shown in Table 2. Thus, as shown in FIGS. 4 and 5, the external address bit $A_{15}$ is output as the internal address bit $INT_{15}$ without any change, while the external address bit $A_{16}$ is output as the internal address bit $INT_{17}$ and the CAM control signal bit $FX_1$ is output as the internal address bit $INT_{16}$. In this case, as in the above case, the most significant external address bit $A_{17}$ is invalidated since the external address bit $A_{16}$ is output as the internal address bit $INT_{17}$ sequencing the external address bits $A_{16}$ to $A_{-1}$. As shown in FIG. 7, the accessible memory capacity is therefore reduced to 2M bits.

When the value of the CAM control signal bit $FX_1$ is "0", only the two regions A of 1M bits each are effective among the entire memory region of 4M bits. When the value is "1", only the two regions B of 1M bits each are effective. As in the above case, the value of the CAM control signal bit $FX_1$ can be set so that the regions A or B having no defective memory cells are made effective. With this setting, a nonvolatile semiconductor memory device having defective memory cells can be recovered as a good nonvolatile memory device wherein only normal memory cells can be accessed, though the memory capacity thereof is halved.

When the CAM data of pattern (3) shown in Table 1 is set in the first CAM circuit 9, only the values of the CAM control signal bits $SM_4$, $SM_5$, and $SM_{10}$ are "1" as shown in Table 2. Thus, as shown in FIGS. 4 and 5, the external address bit $A_{15}$ is output as the internal address bit $INT_{16}$, the external address bit $A_{16}$ as the internal address bit $INT_{17}$, and the CAM control signal bit $FX_0$ as the internal address bit $INT_{15}$. Thus, the external address bits $A_{16}$ to $A_{-1}$ are sequenced. Since the most significant external address bit $A_{17}$ is invalidated, the accessible memory capacity is reduced to 2M bits.

Figure 8:
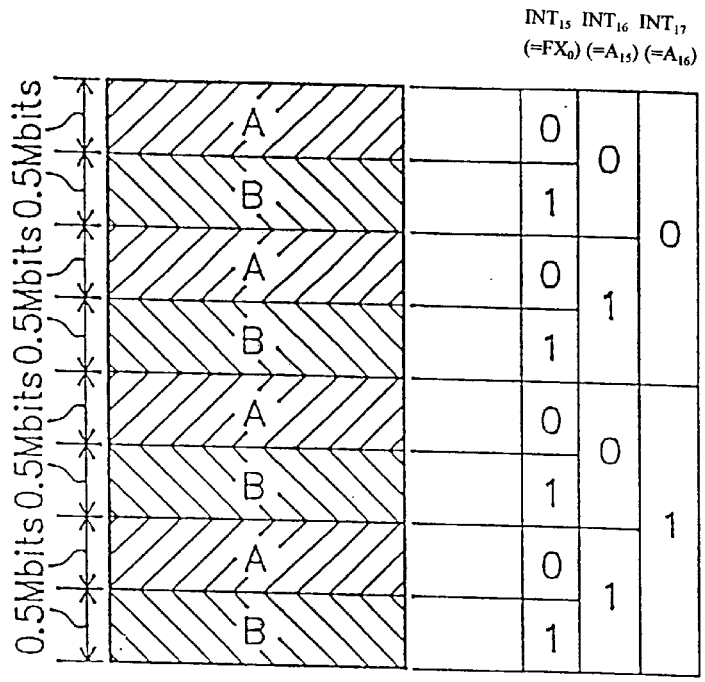
FIG. 8 is a third memory map of the nonvolatile semiconductor memory device of Example 1 when only 2M bits are available.

As shown in FIG. 8, when the value of the CAM control signal bit $FX_0$ is "0", only the four regions A of 0.5M bits each are effective among the entire memory region of 4M bits. When the value is "1", only the four regions B of 0.5M bits each are effective. As in the above case, the value of the CAM control signal bit $FX_0$ can be set so that the regions A or B having no defective memory cell are made effective. With this setting, a nonvolatile semiconductor memory device having defective memory cells can be recovered as a good nonvolatile memory device wherein only normal memory cells can be accessed, though the memory capacity thereof is halved.

In the CAM data of patterns (1) to (3) above, the region(s) including defective memory cells is invalidated by halving the memory capacity to 2M bits. One pattern is selected from these patterns so that all of defective memory cells are included only in either the region(s) A or the region(s) B. The CAM control signal bit $FX_0$, $FX_1$, or $FX_2$ is set at a value which makes the region(s) A or B including no defective memory cell effective.

When the CAM data of pattern (4) shown in Table 1 is set in the first CAM circuit 9, only the values of the CAM control signal bits $SM_1$, $SM_8$, and $SM_{12}$ are "1" as shown in Table 2. Thus, as shown in FIGS. 4 and 5, the external address bit $A_{15}$ is output as the internal address bit $INT_{15}$ without any change, while the CAM control signal bits $FX_1$ and $FX_2$ are output as the internal address bits $INT_{16}$ and $INT_{17}$. In this case, the two most significant external address bits $A_{17}$ and $A_{16}$ are invalidated. Thus, the number of bits of the address available for accessing to the memory cells is decreased by two bits. The accessible memory capacity is therefore reduced to 1M bits.

Figure 9:
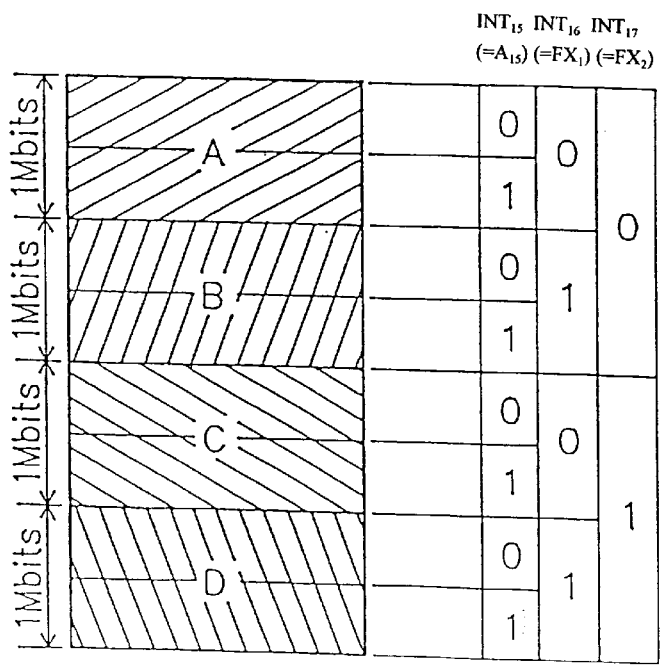
FIG. 9 is a first memory map of the nonvolatile semiconductor memory device of Example 1 when only 1M bits are available.

As shown in FIG. 9, any one of regions A to D of 1M bits each is made effective among the entire memory region of 4M bits depending on the combination of the CAM control signal bits $FX_1$ and $FX_2$. The values of the CAM control signal bits $FX_1$ and $FX_2$ can be set so that, even though three regions among the four regions A to D include defective memory cells, the remaining region A, B, C, or D having no defective memory cell is made effective. With this setting, a nonvolatile semiconductor memory device having defective memory cells can be recovered as a good nonvolatile memory device wherein only normal memory cells can be accessed, though the memory capacity thereof is quartered.

When the CAM data of pattern (5) shown in Table 1 is set in the first CAM circuit 9, only the values of the CAM control signal bits $SM_4$, $SM_5$, and $SM_{12}$ are "1" as shown in Table 2. Thus, as shown in FIGS. 4 and 5, the external address bit $A_{15}$ is output as the internal address bit $INT_{16}$, and the CAM control signal bits $FX_0$ and $FX_2$ are output as the internal address bits $INT_{15}$ and $INT_{17}$, respectively. In this case, the external address bits $A_{15}$ to $A_{-1}$ are sequenced. Since the two most significant external address bits $A_{17}$ and $A_{16}$ are invalidated, the accessible memory capacity is reduced to 1M bits.

Figure 10:
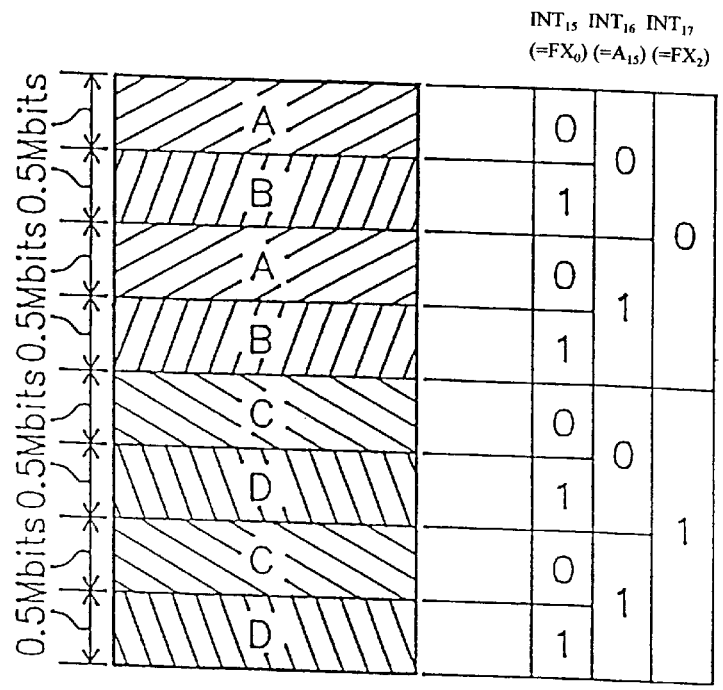
FIG. 10 is a second memory map of the nonvolatile semiconductor memory device of Example 1 when only 1M bits are available.

As shown in FIG. 10, only the two regions A, B, C, or D of 0.5M bits each are made effective among the entire memory region of 4M bits depending on the combination of the CAM control signal bits $FX_0$ and $FX_2$. The values of the CAM control signal bits $FX_0$ and $FX_2$ can be set so that the regions A, B, C, or D having no defective memory cell are made effective. With this setting, a nonvolatile semiconductor memory device having defective memory cells can be recovered as a good nonvolatile memory device wherein only normal memory cells can be accessed, though the memory capacity thereof is quartered.

When the CAM data of pattern (6) shown in Table 1 is set in the first CAM circuit 9, only the values of the CAM control signal bits $SM_4$, $SM_8$, and $SM_9$ are "1" as shown in Table 2. Thus, as shown in FIGS. 4 and 5, the external address bit $A_{15}$ is output as the internal address bit $INT_{17}$, and the CAM control signal bits $FX_0$ and $FX_1$ are output as the internal address bits $INT_{15}$ and $INT_{16}$, respectively. In this case, the external address bits $A_{15}$ to $A_{-1}$ are sequenced. Since the two most significant external address bits $A_{17}$ and $A_{16}$ are invalidated, the accessible memory capacity is reduced to 1M bits.

Figure 11:
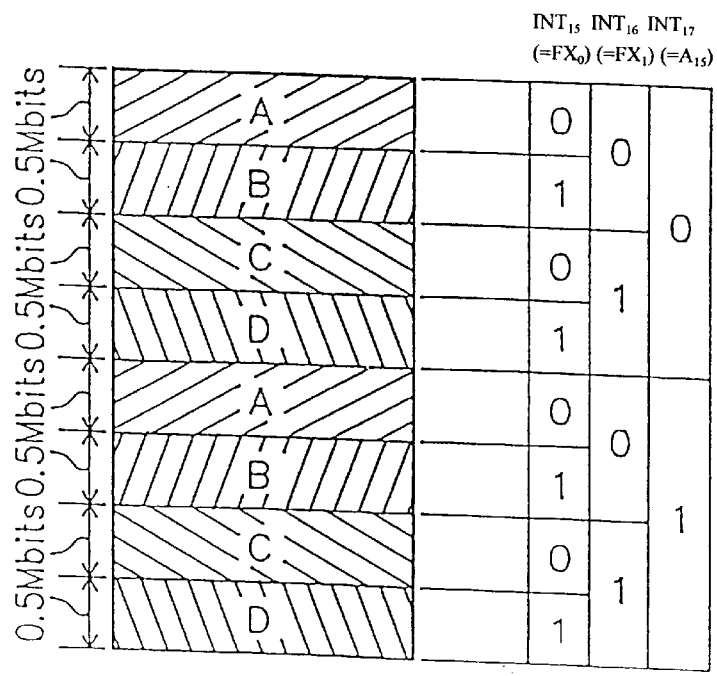
FIG. 11 is a third memory map of the nonvolatile semiconductor memory device of Example 1 when only 1M bits are available.

As shown in FIG. 11, only the two regions A, B, C, or D of 0.5M bits each are made effective among the entire memory region of 4M bits depending on the combination of the CAM control signal bits $FX_0$ and $FX_1$. As in the above case, the values of the CAM control signal bits $FX_0$ and $FX_1$ can be set so that the regions A, B, C, or D having no defective memory cell is made effective. With this setting, a nonvolatile semiconductor memory device having defective memory cells can be recovered as a good nonvolatile memory device wherein only normal memory cells can be accessed, though the memory capacity thereof is quartered.

In the CAM data of patterns (4) to (6) above, the regions including defective memory cells are invalidated by quartering the memory capacity to 1M bits. One pattern is selected from these patterns so that no defective memory cell is included in at least the region(s) A, B, C, or D. The CAM control signal bits $FX_0$ to $FX_2$ are set at values which make the region(s) A, B, C, or D including no defective memory cell effective.

Figure 12:
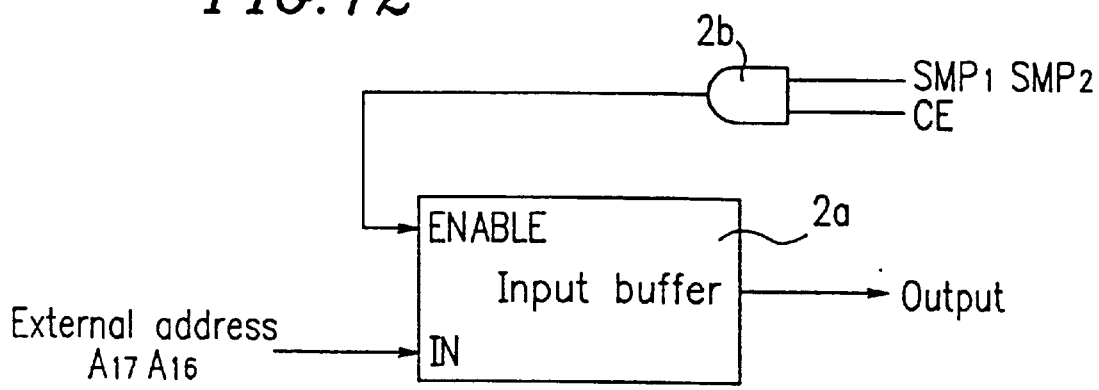
FIG. 12 is a block diagram showing the configuration of part of an address buffer in accordance with Example 1.

The address buffer 2 includes 19 input buffers 2a as shown in FIG. 12, through which the external address bits $A_{17}$ to $A_{-1}$ are input. The internal chip enable signal CE input via the input buffer 4 shown in FIG. 1 is supplied to each of the input buffers 2a as discussed below. The input buffers 2a may be activated only when the internal chip enable signal CE is active (H level in this case).

As for the input buffers 2a for receiving the two most significant external address bites $A_{17}$ and $A_{16}$, the internal chip enable signal CE is input into the ENABLE terminal of each of the input buffers 2a via an input terminal of corresponding AND circuit 2b. The CAM control signal bit $SMP_1$ or $SMP_2$ supplied from the first CAM circuit 9 is input into the other input terminal of the AND circuit 2b. More specifically, the CAM control signal bits $SMP_1$ and $SMP_2$ are input into the AND circuits 2b for the input buffers 2a for receiving the external address bit $A_{17}$ and $A_{16}$, respectively.

With the above configuration, when the CAM data in the first CAM circuit 9 is a predetermined value without any setting, the values of the CAM control signal bits $SMP_1$ and $SMP_2$ are "1". Thus, the input buffers 2a for receiving the external address bits $A_{17}$ and $A_{16}$ conduct the input operation in response to the internal chip enable signal CE.

However, when any of three patterns (1) to (3) shown in Table 1 is set in the first CAM circuit 9, the value of the CAM control signal bit $SMP_1$ is "0" as shown in Table 3, putting the input buffer 2a for receiving the external address bit $A_{17}$ in a disabled state where no operation is conducted irrespective of the internal chip enable signal CE. Thus, in the cases of the CAM data of patterns (1) to (3) where the most significant external address bit $A_{17}$ is invalidated, the input buffer 2a for receiving the external address bit $A_{17}$ is disabled to save wasteful power consumption. Furthermore, when any of three patterns (4) to (6) shown in Table 1 is set in the first CAM circuit 9, the values of the CAM control signal bits $SMP_1$ and $SMP_2$ are "0" as shown in Table 3, putting the two input buffers 2a for receiving the external address bites $A_{17}$ and $A_{16}$ in the disabled state. Thus, in the cases of the CAM data of patterns (4) to (6) where the two most significant external address bits $A_{17}$ and $A_{16}$ are invalidated, the input buffers 2a for receiving the external address bits $A_{17}$ and $A_{16}$ are disabled to save wasteful power consumption.

The second CAM circuit 10 shown in FIG. 1 has substantially the same configuration as that of the first CAM circuit 9. That is, the second CAM circuit 10 sets CAM data and sends a CAM control signal to the address switch circuit 3 and the address buffer 2 based on the CAM data. As in FIGS. 4 and 5, the address switch circuit 3 includes a circuit for switching the corresponding relationship between the external address bits $A_{17}$ to $A_{-1}$ and the internal address bits $INT_{17}$ to $INT_1$. Likewise, as in FIG. 12, the address buffer 2 includes a circuit for disabling the input buffer 2a for receiving any of the external address bits $A_{17}$ to $A_{-1}$ based on the CAM control signal sent from the second CAM circuit 10. The second CAM circuit 10 also sends a 1-bit CAM control signal SP to one of the input terminals of an AND circuit 11 (FIG. 1) based on the CAM data set in the second CAM circuit 10. The other input terminal of the AND circuit 11 receives the source voltage $V_{CC}$, and the output of the AND circuit 11 is input into the ENABLE terminal of the input buffer 6 for receiving the byte signal BYTE bar. Thus, when the second CAM circuit 10 sends the CAM control signal SP of L level to the AND circuit 11, the input buffer 6 is disabled.

Figure 13:
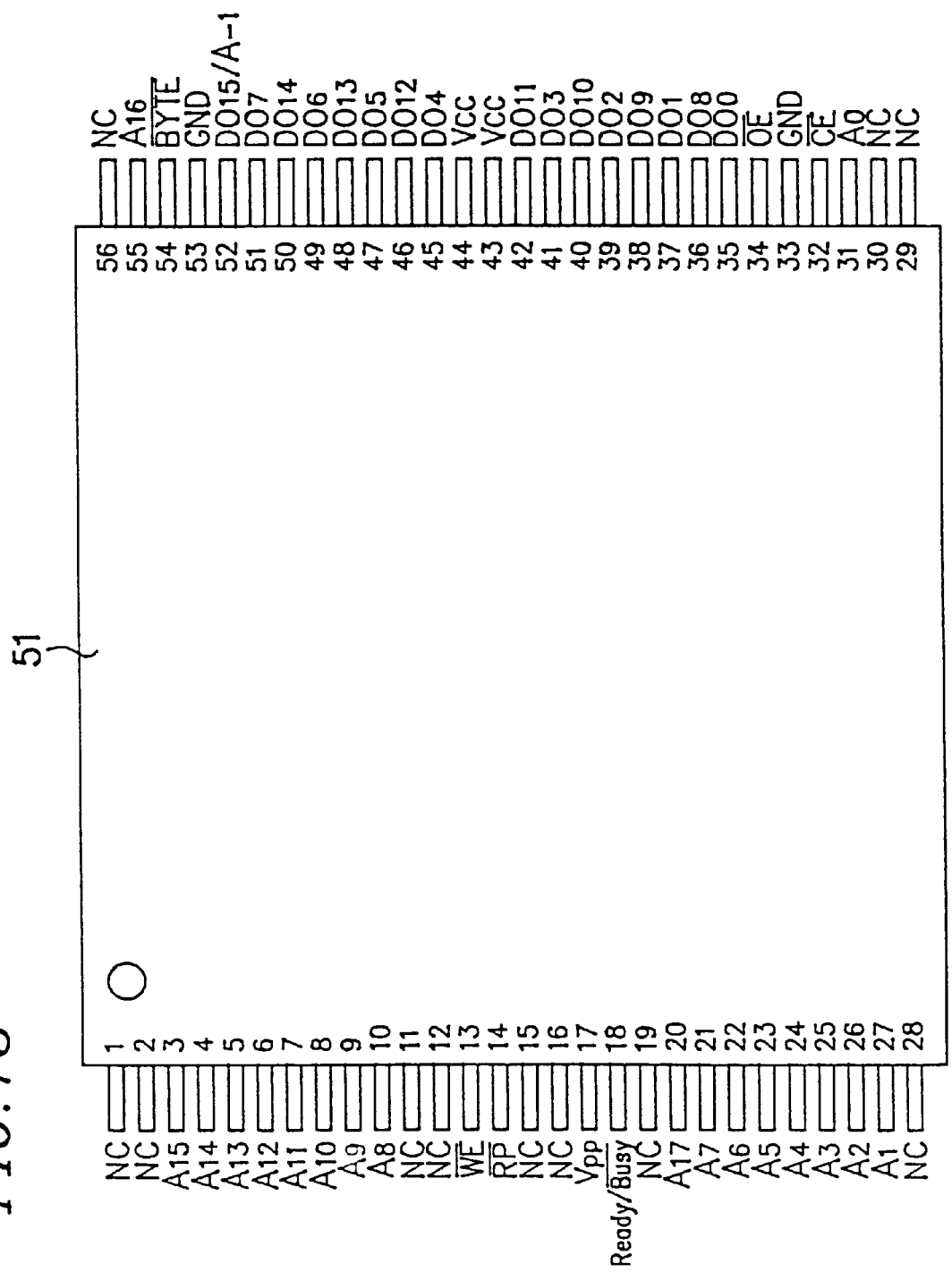
FIG. 13 is a plan view of a first package of the nonvolatile semiconductor memory device of Example 1.

FIG. 13 shows an example of a package for a semiconductor chip of the nonvolatile semiconductor memory device according to the present invention. A package 51 has 56 pins including 19 pins $A_{17}$ to $A_{-1}$ for receiving the external address bits $A_{17}$ to $A_{-1}$, 16 pins $D0_0$ to $D0_{15}$ for receiving and outputting data $D_0$ to $D_{15}$, a pin BYTE bar for receiving the byte signal BYTE bar, a pin RP bar for receiving the reset signal RP bar, and a pin Ready/Busy bar for outputting a ready signal Ready/Busy bar. The byte signal BYTE bar switches the 8-bit configuration and the 16-bit configuration as described above. The 8-bit configuration is selected when the signal is in L level, while the 16-bit configuration is selected when it is in H level. The reset signal RP bar serves to reset internal circuits in the nonvolatile semiconductor memory device. The ready signal Ready/Busy bar indicates that the nonvolatile semiconductor memory device is ready when the signal is in H level and busy when it is in L level.

Figure 14:
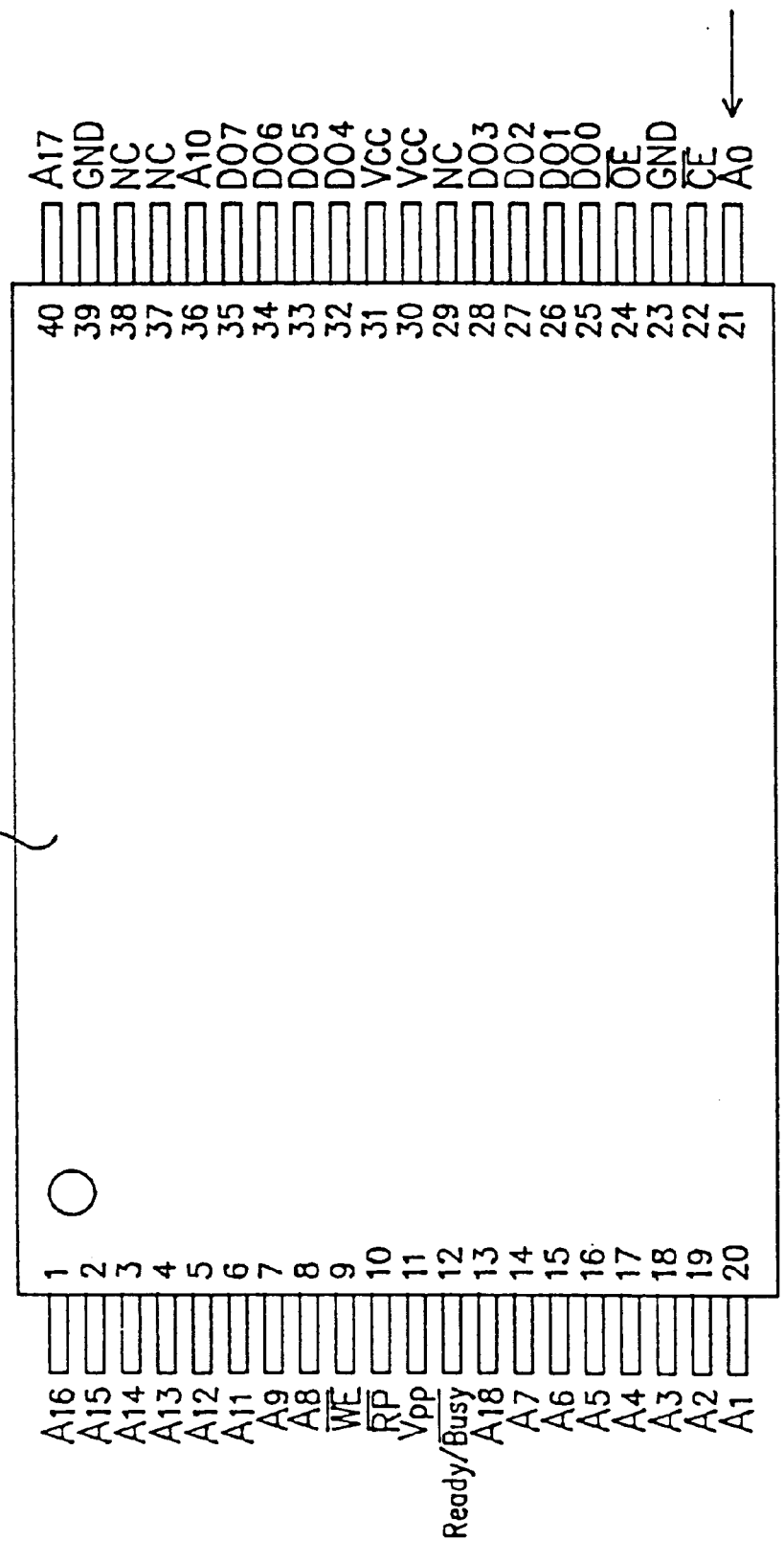
FIG. 14 is a plan view of a second package of the nonvolatile semiconductor memory device of Example 1.

FIG. 14 shows another package 52 having 40 pins. The package 52 does not include the pin BYTE bar for receiving the byte signal BYTE bar. Therefore, the external address bits $A_{17}$ to $A_{-1}$ are received by 19 pins $A_{18}$ to $A_0$ of which subscripts are one larger than those of the corresponding external address bits. Also, since only the 8-bit configuration is available, only 8-bit data $D_0$ to $D_7$ are input/output through eight pins $D0_0$ to $D0_7$.

Figure 15:
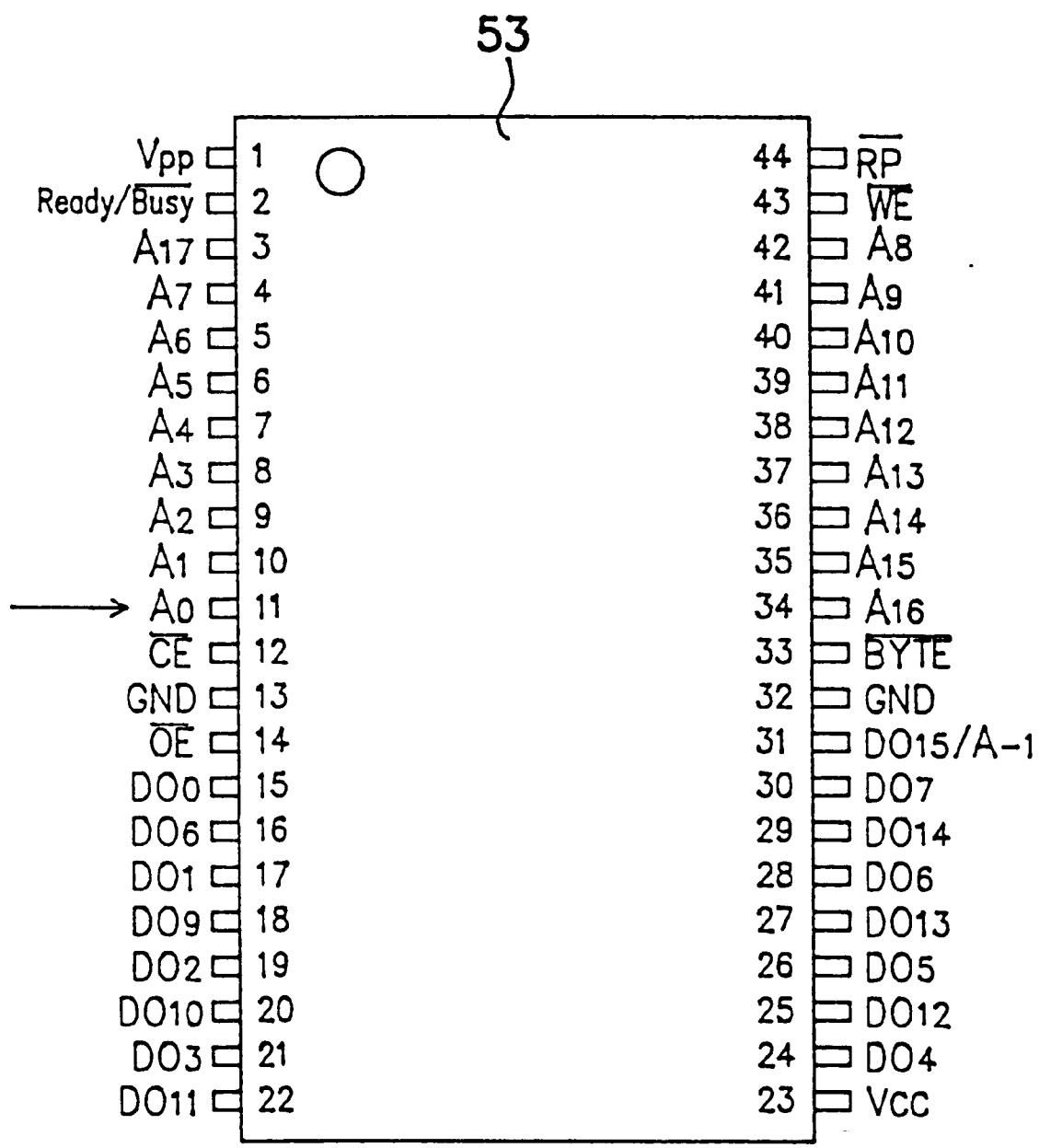
FIG. 15 is a plan view of a third package of the nonvolatile semiconductor memory device of Example 1.

FIG. 15 shows still another package 53 having 44 pins. The pin configuration is the same as that of the package 51, except that the pin $A_0$ for receiving the external address bit $A_0$, for example, is located on the left side though it is located on the right side in the package 51.

In the case where the nonvolatile semiconductor memory device of the present invention is packaged into the package 51, the bit configuration must be switchable. To accomplish this, the CAM data which turns the CAM control signal SP to H level is set in the second CAM circuit 10, so that the input buffer 6 is kept activated to receive the byte signal BYTE bar.

In the case where the nonvolatile semiconductor memory device of the present invention is packaged into the package 52, the bit configuration must be fixed to the 8-bit configuration. To accomplish this, the CAM data which turns the CAM control signal SP to L level is set in the second CAM circuit 10, so that the input buffer 6 is disabled and the internal byte signal BYTE bar which is the output of the input buffer 6 is kept in L level to fix the bit configuration to the 8-bit configuration internally.

In the case where the nonvolatile semiconductor memory device of the present invention is packaged into the package 53, since the pin arrangement is largely different from that of the package 51, wire bonding and the like may become difficult. In such a case, the arrangement of electrode pads on the semiconductor chip may be changed by changing the corresponding relationship between the external address bits $A_{17}$ to $A_{-1}$ and the internal address bits $INT_{17}$ to $INT_{-1}$ based on the CAM control signal sent from the second CAM circuit 10 to the address switch circuit 3. Using the second CAM circuit 10, similar measures can also be taken for the data $D_0$ to $D_{15}$ and the control signals. Conventionally, for a semiconductor chip which may be packaged into different types of packages, a plurality of electrode pads connected to a signal line for an internal signal are provided so that an appropriate electrode pad can be selected for wire bonding depending on the type of the package. In the nonvolatile semiconductor memory device of the present invention, these electrode pads are not connected with one another by metal wirings and the like. Instead, only electrode pads required by the packaging are connected to the internal signal lines based on the CAM control signal sent from the second CAM circuit 10, while other electrode pads are cut off. This overcomes the drawback that the input capacity increases due to the operation of a plurality of input buffers provided for the plurality of unused electrode pads left connected.

The CAM data set in the second CAM circuit 10 and the like can be rewritten over and over again until immediately before the packaging. It is possible therefore to obtain a product with a configuration rightly responding to the needs of the user at the time immediately before the delivery.

In the setting of CAM data in the second CAM circuit 10, a predetermined value used when no setting is made can be determined as in the first CAM circuit 9. Then, a common examination using the same test apparatus and jig can be conducted for nonvolatile semiconductor memory devices having different CAM data set therein. Such a predetermined value is preferably one that most satisfies the needs of the user at the time of the setting. The predetermined value of the CAM data can be easily changed depending on, for example, which one of the MOSFETs 95, 95 shown in FIG. 23 is used to couple the inverter 99 to the source thereof. Alternatively, the predetermined value can be changed by replacing the inverter 99 with a buffer.

Example 2

Figure 16:
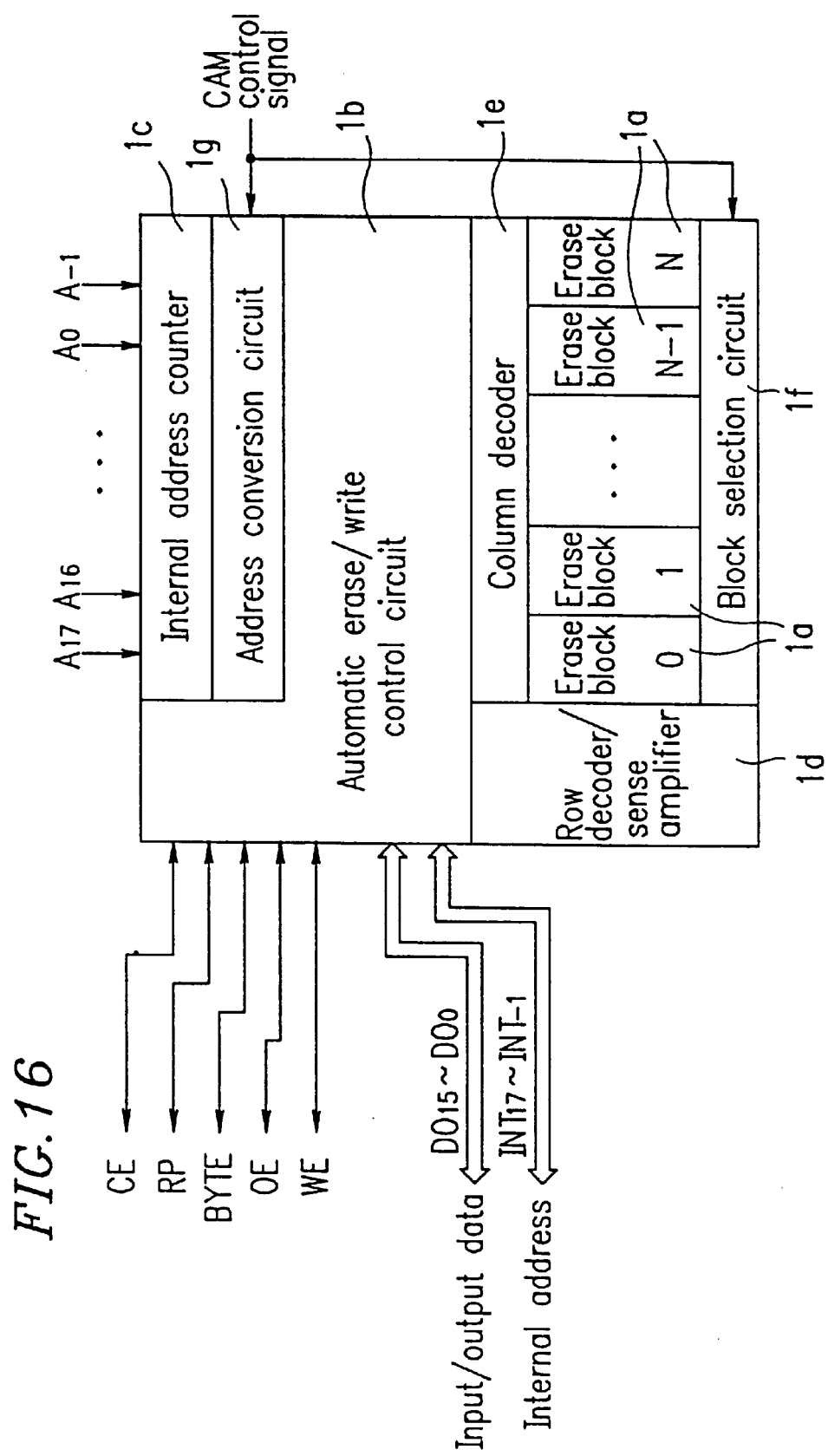
FIG. 16 is a block diagram showing the configuration of a memory of a nonvolatile semiconductor memory device of Example 2.

A second example of the nonvolatile semiconductor memory device according to the present invention will be described with reference to FIG. 16. FIG. 16 is a block diagram showing the configuration of a memory of the nonvolatile semiconductor memory device. Components having functions similar to those of the components in Example 1 shown in FIG. 1 are denoted by the same reference numerals, and the description thereof is omitted.

In this example, the nonvolatile semiconductor memory device such as a flash memory provided with an automatic erase/write control circuit will be described. In the following description, it is assumed that input circuits for the control signals such as the external address bits $A_{17}$ to $A_{-1}$ and the chip enable signal CE bar have the same configurations as those described in Example 1 and that the signal switching and the signal level fixing are conducted by the first and second CAM circuits 9 and 10.

As shown in FIG. 16, the memory 1 of the nonvolatile semiconductor memory device of this example includes a memory cell array which is divided into N+1 erase blocks 1a. An automatic erase/write control circuit 1b executes the write operation for writing data in memory cells in the erase blocks 1a and the erase operation for erasing the data in the memory cells every erase blocks 1a. The automatic erase/write control circuit 1b includes an internal address counter 1c. A row decoder/sense amplifier 1d and a column decoder 1e specify memory cells in the erase blocks 1a based on the internal address bits $INT_{17}$ to $INT_{-1}$. A block selection circuit 1f specifies the erase blocks 1a to be erased.

In the flash memory with the above configuration, when it is attempted to erase data completely by one erase operation, the excessive erasure where an excessive amount of electrons are drawn off from a floating gate may occur as described earlier. To overcome this problem, pre-erase write is first conducted for memory cells in the erase block to be erased, and then the weak erase operation is repeated. Every time the erase operation has been conducted, all the memory cells in the erase block are read to confirm that all the memory cells have been erased to a predetermined level (erase verification). The erase operation is repeated until complete erasure is confirmed by the erase verification. Thus, excessive erasure can be avoided by conducting a minimal amount of the necessary erase operation.

In general, in the erase verification, the internal address counter 1c of the automatic erase/write control circuit 1b counts the address in the erase block 1a starting from the head address as the initial value, thus sequentially generating the read address. In the case where bits in the middle of the internal address bits $INT_{17}$ to $INT_{-1}$ are fixed by the first CAM circuit 9 and the like as described in Example 1, effective regions of the memory cells are no longer sequential but separated at predetermined intervals. If the internal address counter 1c counts the address sequentially to perform erase verification of all memory cells in the chip or each erase block, address bits for invalid regions may also be generated.

In order to avoid this inconvenience, the circuitry of the internal address counter 1c may be changed using a CAM circuit in the following manner. That is, the output of a digit $INT_x$ of the internal address counter 1c corresponding to a fixed bit of the internal address bits INT is fixed. Thus, when a digit $INT_{x-1}$ is carried by one digit, the digit $INT_x$ does not change, but a digit $INT_{x+1}$ changes. In other words, the carry-over from the less significant digit $INT_{x-1}$ is taken over by the more significant digit $INT_{x+1}$, skipping the fixed digit $INT_x$.

The above change of the circuitry is not possible by using the conventional normal internal address counter 1c, but requires redesigning the internal address counter 1c.

To overcome this problem, an address conversion circuit 1g which converts the count value output from the internal address counter 1c is provided in the automatic erase/write control circuit 1b. The address conversion circuit 1g resembles the address switch circuit 3, and generates bits of an internal count address by the switching operation as is done by the address switch circuit 3 using the CAM control signal bits $SM_1$ to $SM_{12}$ and the CAM control signal bits $FX_0$ to $FX_2$. Thus, the internal address bits output from the address conversion circuit 1g point to only address bits of normal memory cells. The above inconvenience is thus avoided by executing the erase verification using the internal address output from the address conversion circuit 1g.

More specifically, the automatic erase/write control circuit 1b determines the initial count value based on the internal address bits sent from the address conversion circuit 1g. The automatic erase/write control circuit 1b increments or decrements the internal address bits based on the determined initial value, and erases data stored in the memory cells corresponding to the address bits obtained by the increment or the decrement. Thus, data in the memory cells in the erase block can be erased by the increment or the decrement by the automatic erase/write control circuit 1b.

Example 3

Figure 17:
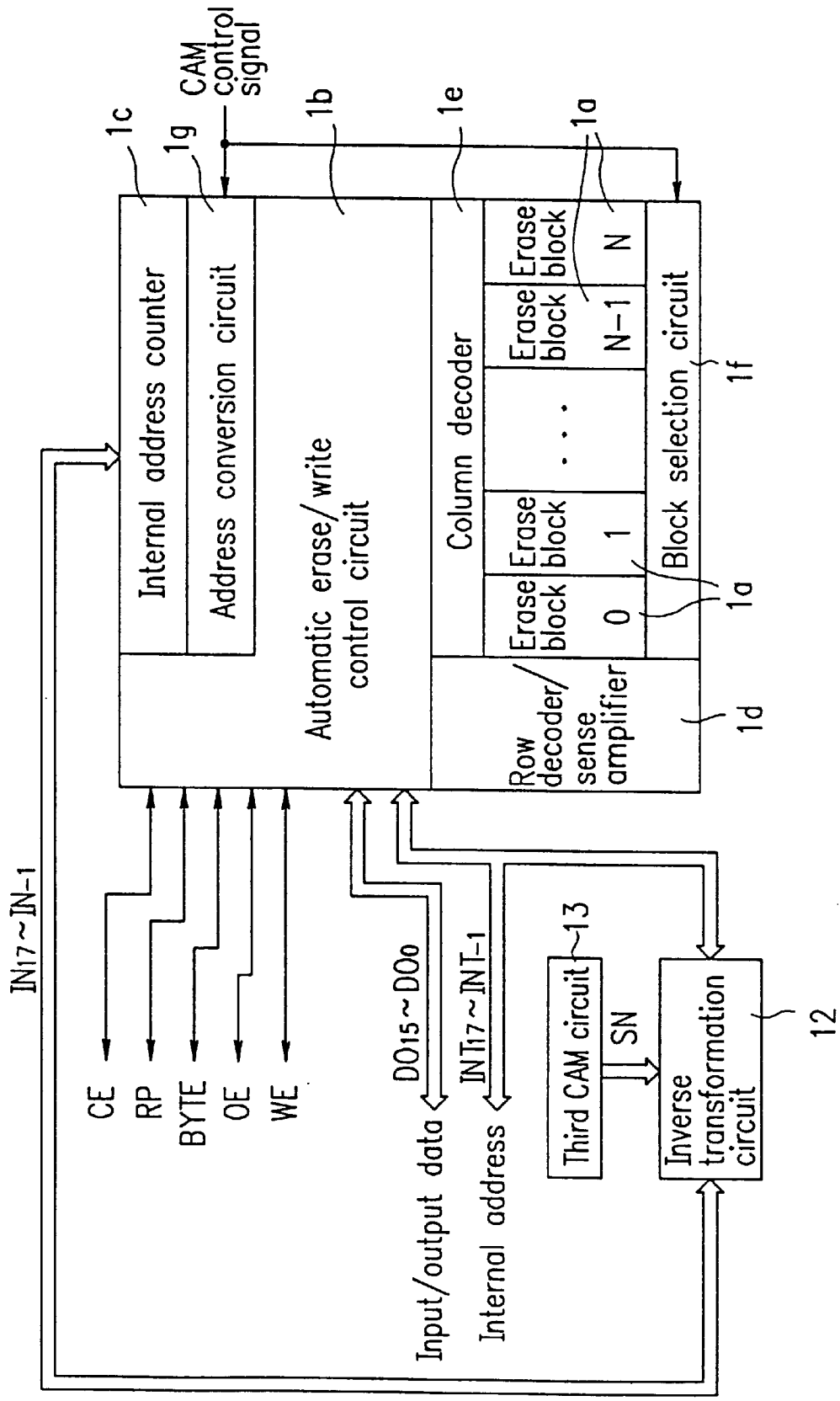
FIG. 17 is a block diagram showing the configuration of a memory of a nonvolatile semiconductor memory device of Example 3.
Figure 18:
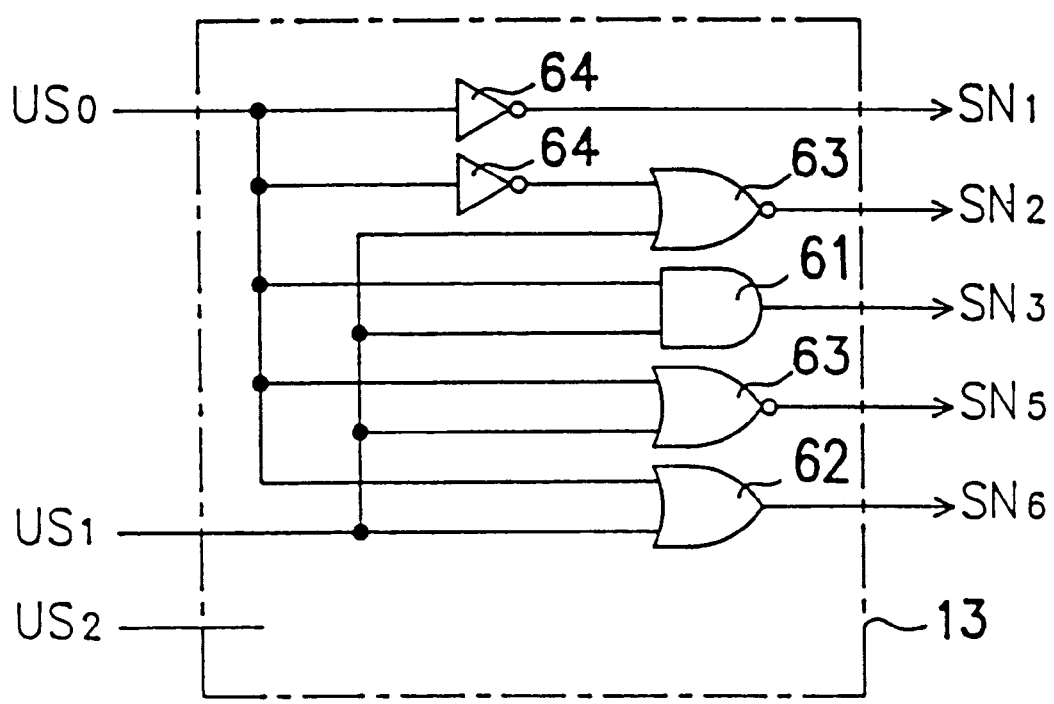
FIG. 18 is a block diagram showing the configuration of a third CAM circuit in accordance with Example 3.
Figure 19:
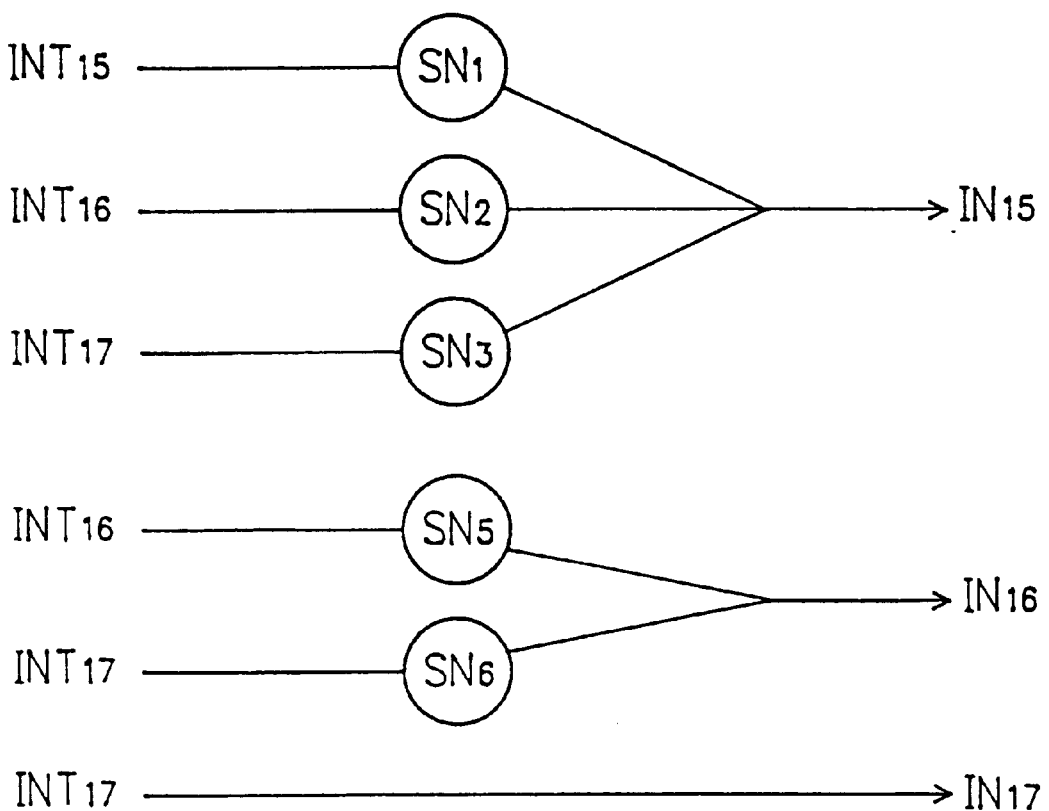
FIG. 19 shows a concept of the function of an inverse transformation circuit in accordance with Example 3.
Figure 20:
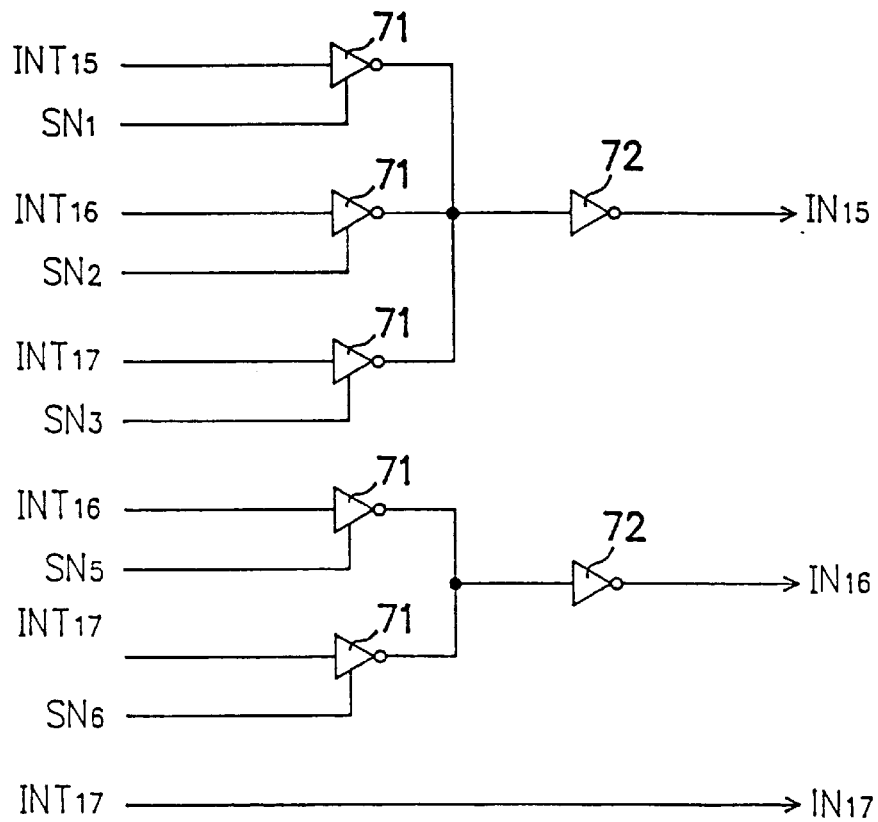
FIG. 20 is a block diagram showing the configuration of the inverse transformation circuit in accordance with Example 3.

A third example of the nonvolatile semiconductor memory device according to the present invention will be described with reference to FIGS. 17 to 20. FIG. 17 is a block diagram showing the configuration of a memory of the nonvolatile semiconductor memory device. FIG. 18 is a block diagram showing the configuration of a third CAM circuit. FIG. 19 shows a concept of the function of an inverse transformation circuit. FIG. 20 is a block diagram showing the configuration of the inverse transformation circuit. Components having functions similar to those of the components in Example 1 shown in FIG. 1 and Example 2 shown in FIG. 16 are denoted by the same reference numerals, and the description thereof is omitted.

As shown in FIG. 17, the nonvolatile semiconductor memory device of this example uses inverse transformation address bits $IN_{17}$ to $IN_{-1}$ obtained by inversely transforming the internal address bits $INT_{17}$ to $INT_{-1}$ by an inverse transformation circuit 12 as the address bits input into the internal address counter of the automatic erase/write control circuit 1b, which is to be used as the initial count value. A CAM control signal SN is sent from a third CAM circuit 13 to the inverse transformation circuit 12.

The third CAM circuit 13 is a logic circuit which generates a CAM control signal of five bits $SN_1$ to $SN_6$ based on the CAM data $US_0$ to $US_2$ set in the first CAM circuit 9. As shown in FIG. 18, the third CAM circuit 13 includes an AND circuit 61, an OR circuit 62, NOR circuits 63, and NOT circuits 64. The third CAM circuit 13 with the configuration shown in FIG. 18 converts the CAM data $US_0$ to $US_2$ into the five CAM control signal bits $SN_1$ to $SN_6$ shown in a truth table of Table 4 below.

TABLE 4

| $US_0$ | $US_1$ | $US_2$ | $SN_1$ | $SN_2$ | $SN_3$ | $SN_5$ | $SN_6$ |
|---|---|---|---|---|---|---|---|
| 0 | 0 | 0 | 1 | 0 | 0 | 1 | 0 |
| 0 | 0 | 1 | 1 | 0 | 0 | 1 | 0 |
| 0 | 1 | 0 | 1 | 0 | 0 | 0 | 1 |
| 1 | 0 | 0 | 0 | 1 | 0 | 0 | 1 |
| 0 | 1 | 1 | 1 | 0 | 0 | 0 | 1 |

TABLE 4-continued

| $US_0$ | $US_1$ | $US_2$ | $SN_1$ | $SN_2$ | $SN_3$ | $SN_5$ | $SN_6$ |
|---|---|---|---|---|---|---|---|
| 1 | 0 | 1 | 0 | 1 | 0 | 0 | 1 |
| 1 | 1 | 0 | 0 | 0 | 1 | 0 | 1 |

As shown in FIG. 19, the inverse transformation circuit 12 switches the corresponding relationship between the three most significant bits ($INT_{17}$ to $INT_{15}$) of the internal address bits $INT_{17}$ to $INT_{-1}$ and the three most significant bits ($IN_{17}$ to $IN_{15}$) of the inverse transformation address bits $IN_{17}$ to $IN_{-1}$ based on the CAM control signal bits $SN_1$ to $SN_6$ sent from the third CAM circuit 13.

For example, as shown in FIG. 20, the inverse transformation circuit 12 includes 3-status buffers 71 and buffers 72 which are normal inverters. The CAM control signal bits $SN_1$ to $SN_6$ are input into the respective control terminals of the 3-status buffers 71. The inverse transformation circuit 12 outputs the inverse transformation address bits based on the CAM control signal bits $SN_1$ to $SN_6$.

With the above structure, when the CAM data in the first CAM circuit 9 is a predetermined value without any setting, only the values of the CAM control signal bits $SN_1$ and $SN_5$ are "1" from Tables 1 and 4. Thus, as shown in FIGS. 19 and 20, the internal address bits $INT_{17}$ to $INT_{15}$ are output as the inverse transformation address bits $IN_{17}$ to $IN_{15}$.

When the CAM data of pattern (1) shown in Table 1 is set in the first CAM circuit 9, only the values of the CAM control signal bits $SN_1$ and $SN_5$ are "1" as shown in Table 4, which is the same as the case of the predetermined value. In this case, since only the most significant internal address bit $INT_{17}$ is fixed, the internal address counter 1c can be used without any change, requiring no inverse transformation.

When the CAM data of pattern (2) shown in Table 1 is set in the first CAM circuit 9, only the values of the CAM control signal bits $SN_1$ and $SN_6$ are "1" as shown in Table 4. The internal address bit $INT_{15}$ is output as the inverse transformation address bit $IN_{15}$, while the internal address bit $INT_{17}$ is output as the inverse transformation address bit $IN_{16}$, skipping the fixed internal address bit $INT_{16}$.

When the CAM data of pattern (3) shown in Table 1 is set in the first CAM circuit 9, only the values of the CAM control signal bits $SN_2$ and $SN_6$ are "1" as shown in Table 4. The internal address bit $INT_{16}$ is output as the inverse transformation address bit $IN_{15}$, while the internal address bit $INT_{17}$ is output as the inverse transformation address bit $IN_{16}$, skipping the fixed internal address bit $INT_{15}$.

When the CAM data of pattern (4) shown in Table 1 is set in the first CAM circuit 9, only the values of the CAM control signal bits $SN_1$ and $SN_6$ are "1" as shown in Table 4. The internal address bit $INT_{15}$ is output as the inverse transformation address bit $IN_{15}$, while the internal address bit $INT_{17}$ is output as the inverse transformation address bit $IN_{16}$. In this case, since the two most significant internal address bits $INT_{16}$ and $INT_{17}$ are fixed, no substantial inverse transformation is conducted.

When the CAM data of pattern (5) shown in Table 1 is set in the first CAM circuit 9, only the values of the CAM control signal bits $SN_2$ and $SN_6$ are "1" as shown in Table 4. The internal address bit $INT_{16}$ is output as the inverse transformation address bit $IN_{15}$, while the internal address bit $INT_{17}$ is output as the inverse transformation address bit $IN_{16}$, skipping the fixed internal address bit $INT_{15}$ and setting the inverse transformation address bit $IN_{16}$ at the value of the fixed internal address bit $INT_{17}$.

When the CAM data of pattern (6) shown in Table 1 is set in the first CAM circuit 9, only the values of the CAM control signal bits $SN_3$ and $SN_6$ are "1" as shown in Table 4. The internal address bit $INT_{17}$ is output as the inverse transformation address bits $IN_{15}$ and $IN_{16}$. In this case, the internal address bits $INT_{15}$ and $INT_{16}$ are fixed.

The inverse transformation address bits $IN_{17}$ to $IN_{-1}$ correspond to the external address bits $A_{17}$ to $A_{-1}$ at least regarding the address bits affecting the counting. Therefore, by inputting the inverse transformation address-bits $IN_{17}$ to $IN_{-1}$ into the internal address counter 1c as the initial value, the correct internal count address can be generated as in Example 2.

In the flash memory and the like of this example, the erase operation is conducted for every erase block 1a. Accordingly, two types of erase blocks 1a having sizes of, for example, 16k bytes and 32k bytes may be prepared, so as to switch the erase block size depending on 1-bit CAM data in the CAM circuit.

When the erase block size is changed, the maximum count number of the internal address counter 1c also needs to be changed. To accomplish this, the internal address counter 1c is designed in the following manner. That is, when the 1-bit CAM data is in L level, the count operation is terminated after the count corresponding to 16k bytes is completed and the erase verification corresponding to the 16k bytes is conducted. When the CAM data is in H level, the count operation is terminated after the count corresponding to 32k bytes is completed and the erase verification corresponding to the 32k bytes is conducted.

The internal address counter 1c may be designed to actually count exceeding the number corresponding to 32k bytes. In such a case, however, when the 1-bit CAM data is in L level, a count completion signal is sent to the automatic erase/write control circuit 1b upon completion of the count corresponding to 16k bytes, to start next erase operation. When the CAM data is in H level, the count completion signal is sent to the automatic erase/write control circuit 1b upon completion of the count corresponding to 32k bytes to start the next erase operation.

Example 4

Figure 21:
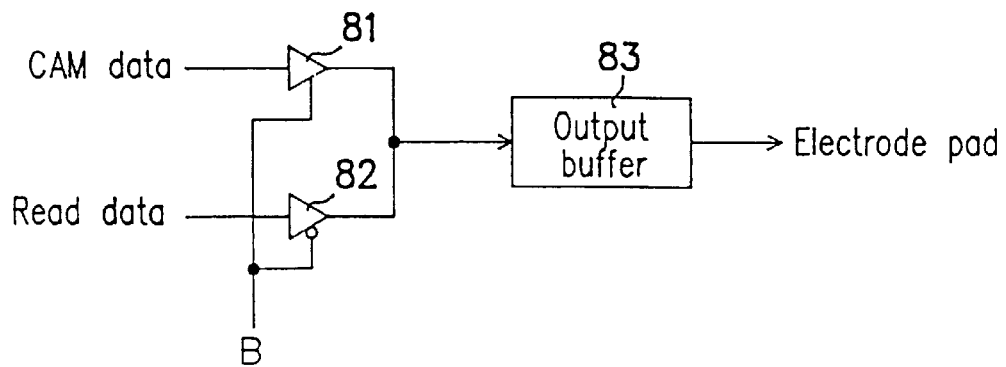
FIG. 21 is a block diagram showing the configuration of an output circuit of a nonvolatile semiconductor memory device of Example 4 according to the present invention.
Figure 22:
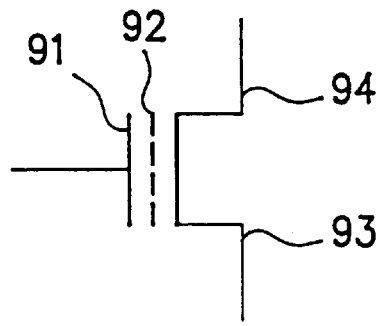
FIG. 22 is a circuit diagram of a memory cell of a conventional flash memory.

A fourth example according to the present invention will be described with reference to FIG. 21. FIG. 21 is a block diagram showing the configuration of an output circuit of the nonvolatile semiconductor memory device of this example. Components having functions similar to those of the components in the above examples shown in FIGS. 1, 16, and 17 are denoted by the same reference numerals, and the description thereof is omitted.

The output circuit of this example is applicable to any of the nonvolatile semiconductor memory devices of Examples 1 to 3. As shown in FIG. 21, data read from a memory cell of the memory 1 is switched to CAM data read from the first CAM circuit 9 or the second CAM circuit 10 by two 3-status buffers 81 and 82, and the result is output to an electrode pad for output via an output buffer 83. A CAM data read signal B is input into the control terminal of the 3-status buffer 81, and an inverted version of the CAM data read signal B is input into the control terminal of the 3-status buffer 82. The CAM data read signal B, which is normally in L level, turns to H level when an external special command or a special combination of control signals is input.

Thus, by switching the nonvolatile semiconductor memory device into a special mode such as a test mode, the CAM data read signal B turns to H level, allowing the CAM data to be retrieved externally via the output buffer 83, thus providing information including the memory capacity and the type of the package. By this easy retrieval of the CAM data, complicated confirmation work at the marking of production numbers on packages and the like can be simplified.

Figure 24:
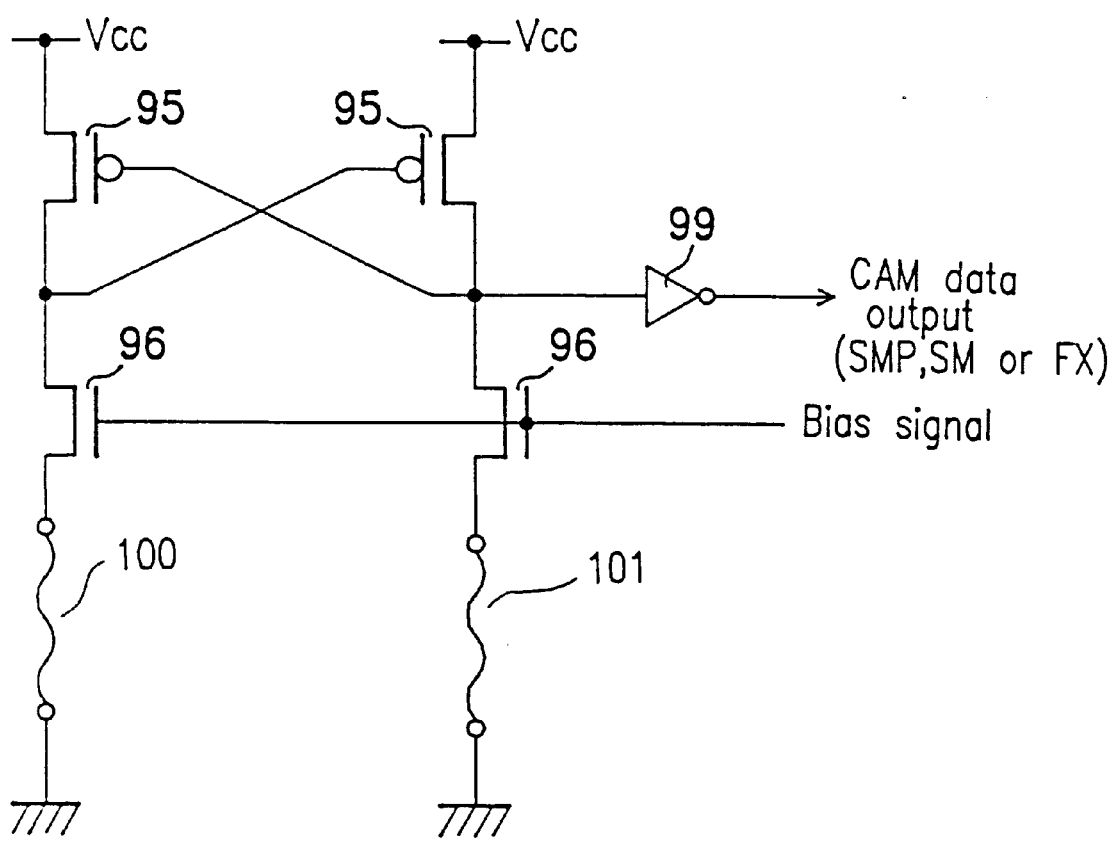
FIG. 24 is a block diagram of CAM circuit.

The configuration of the CAM circuit is not limited to that shown in FIG. 23. For example, a circuit as shown in FIG. 24 may also be used. The circuit shown in FIG. 24 uses fuses 100 and 101 in place of the CAM program circuit 98 and the cell transistors 97 of the circuit shown in FIG. 23. One of the fuses 100 and 101 is cut off by a laser trimming apparatus. Thus, data can be stored in the CAM circuit.

Figure 25:
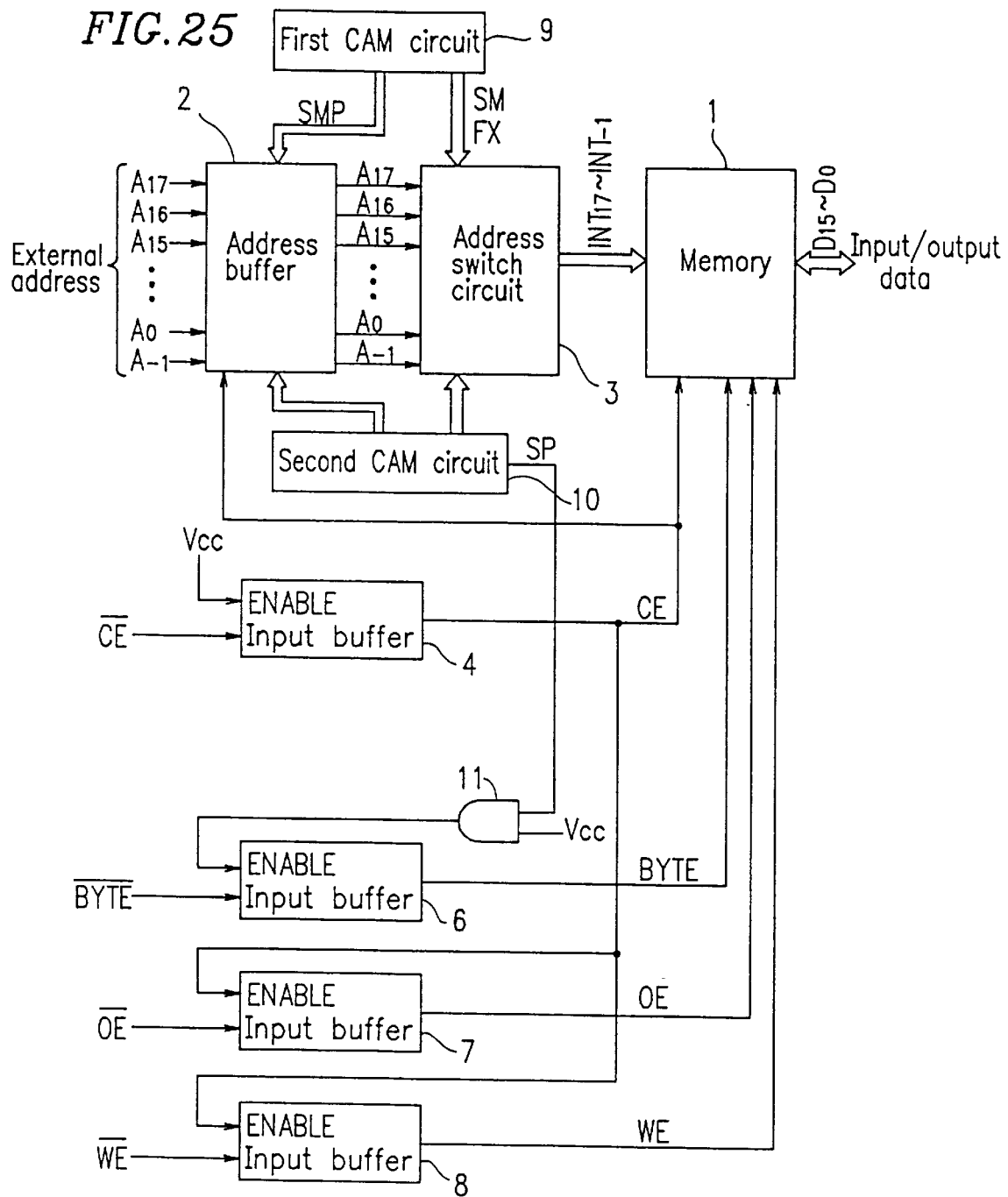
FIG. 25 is a block diagram showing the configuration of a RAM device according to the present invention.
Figure 26:
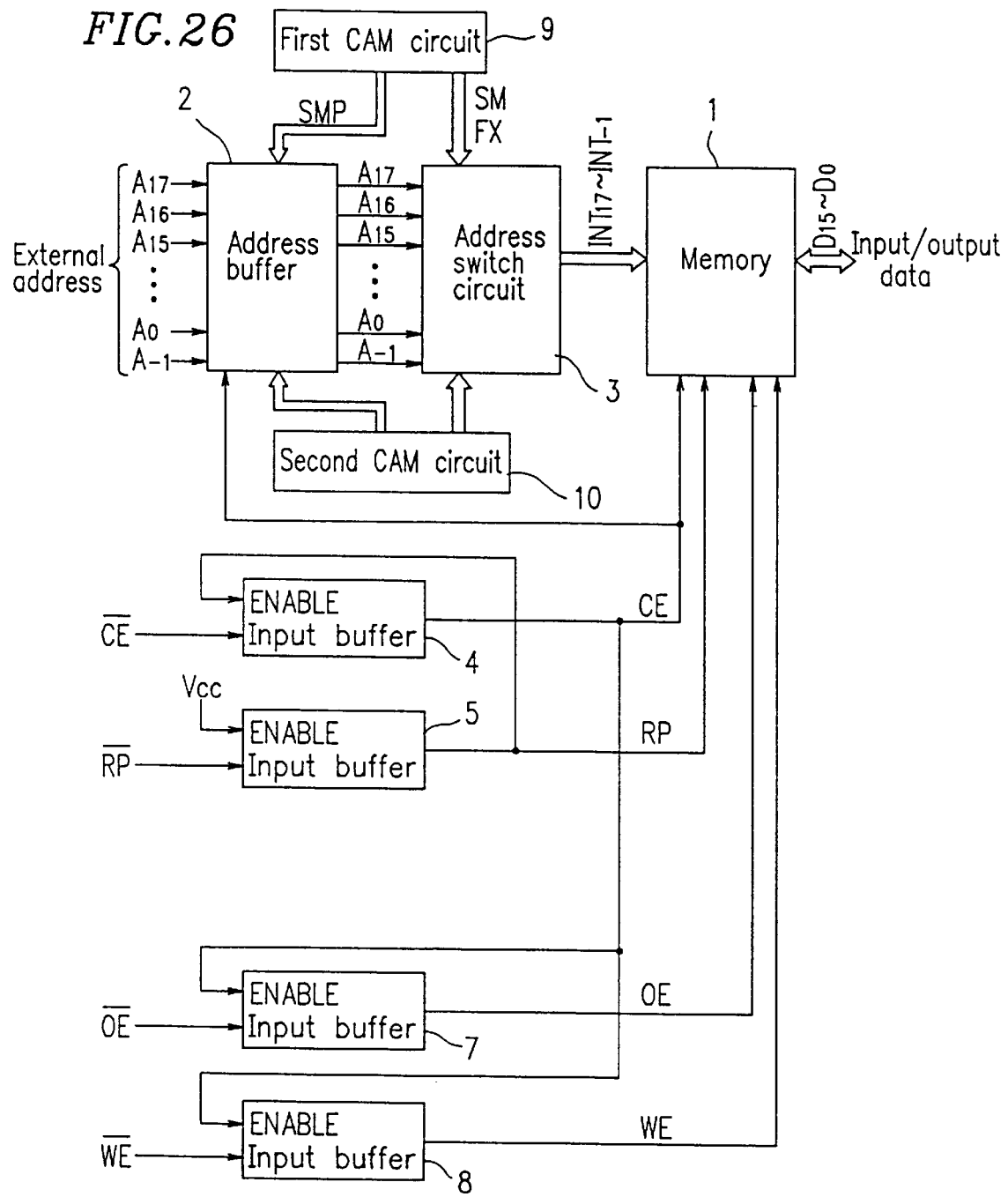
FIG. 26 is a block diagram showing the configuration of a RAM device according to the present invention.
Figure 27:
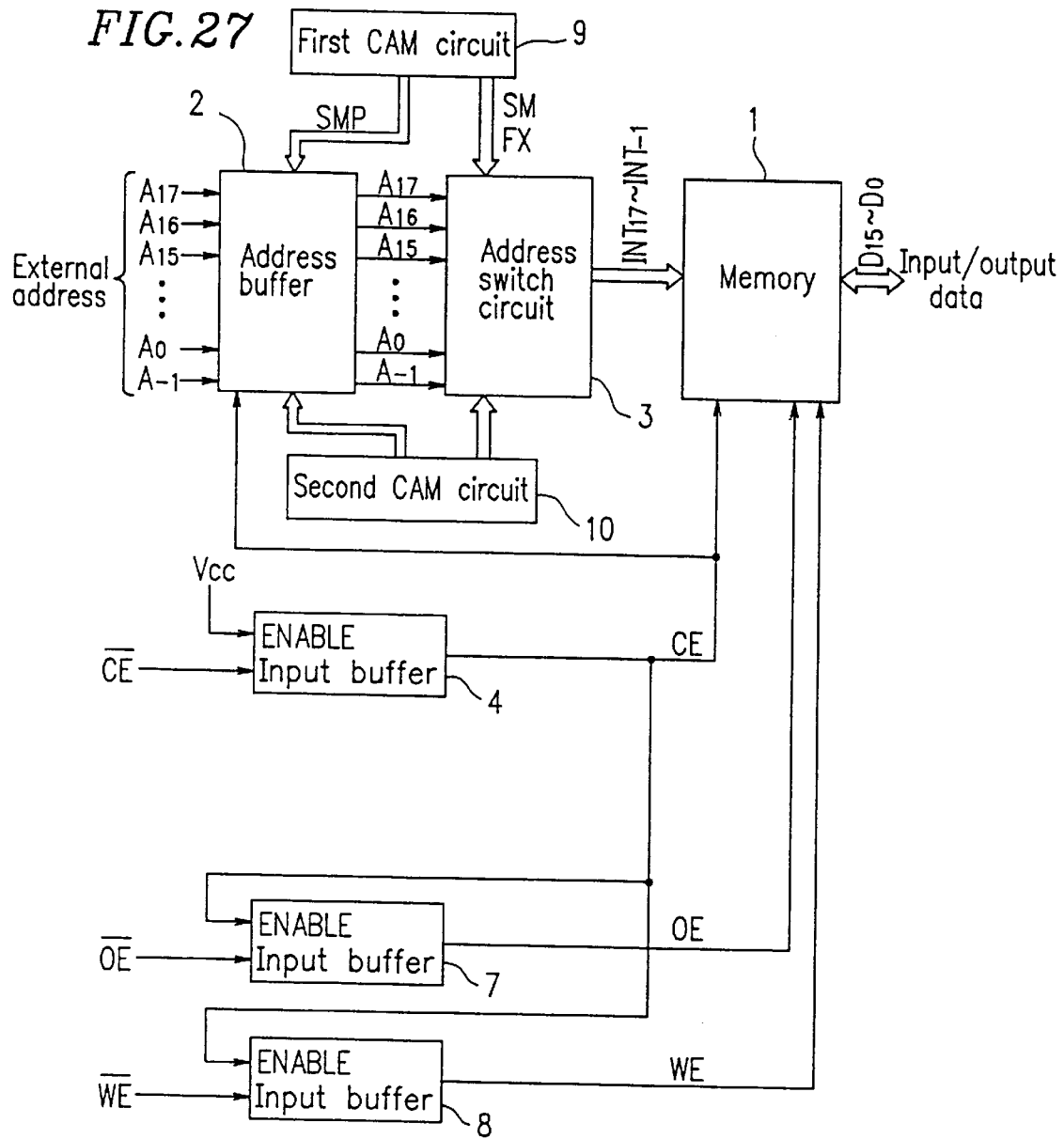
FIG. 27 is a block diagram showing the configuration of a RAM device according to the present invention.

The present invention is also applicable to normal RAMs. A RAM having defective memory cells can be recovered without being discarded if circuitries shown in FIGS. 25 to 27 are used. In the circuitry shown in FIG. 25, the input buffer 5 for receiving the reset signal RP bar is removed from the circuitry shown in FIG. 1. The operation of the circuitry shown in FIG. 25 is basically the same as that of the circuitry shown in FIG. 1. The description of the operation is therefore omit ted. The CAM circuits in the circuitry shown in FIG. 25 preferably have the configuration shown in FIG. 24. In the circuitries shown in FIGS. 26 and 27, the input buffer 6 for receiving the byte signal BYTE bar and the AND circuit 11 are removed from the circuitries shown in FIGS. 1 and 25. In these cases, as in the above case, the RAM having defective memory cells can be recovered without being discarded.

Figure 28:
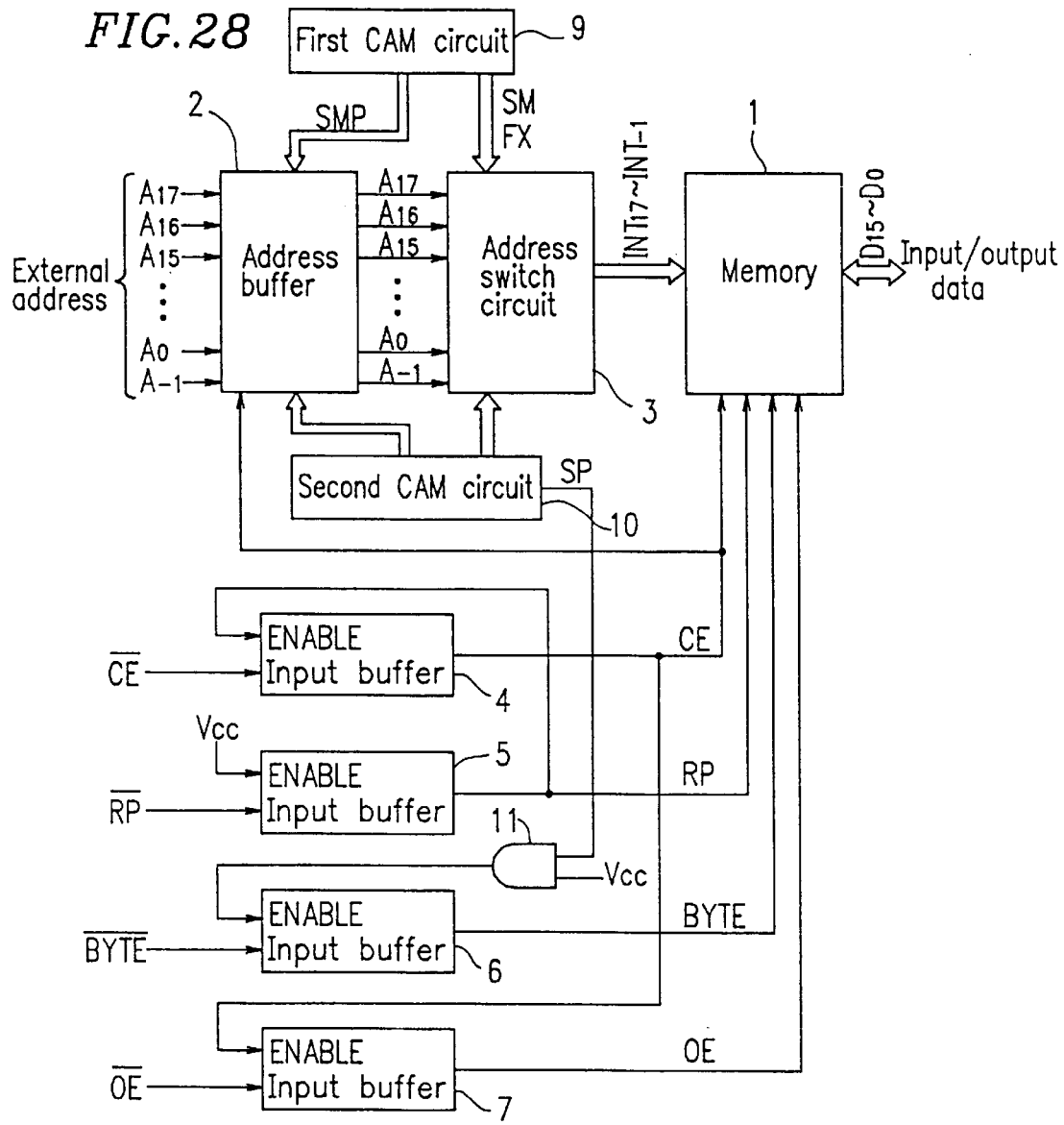
FIG. 28 is a block diagram showing the configuration of a ROM device according to the present invention.
Figure 29:
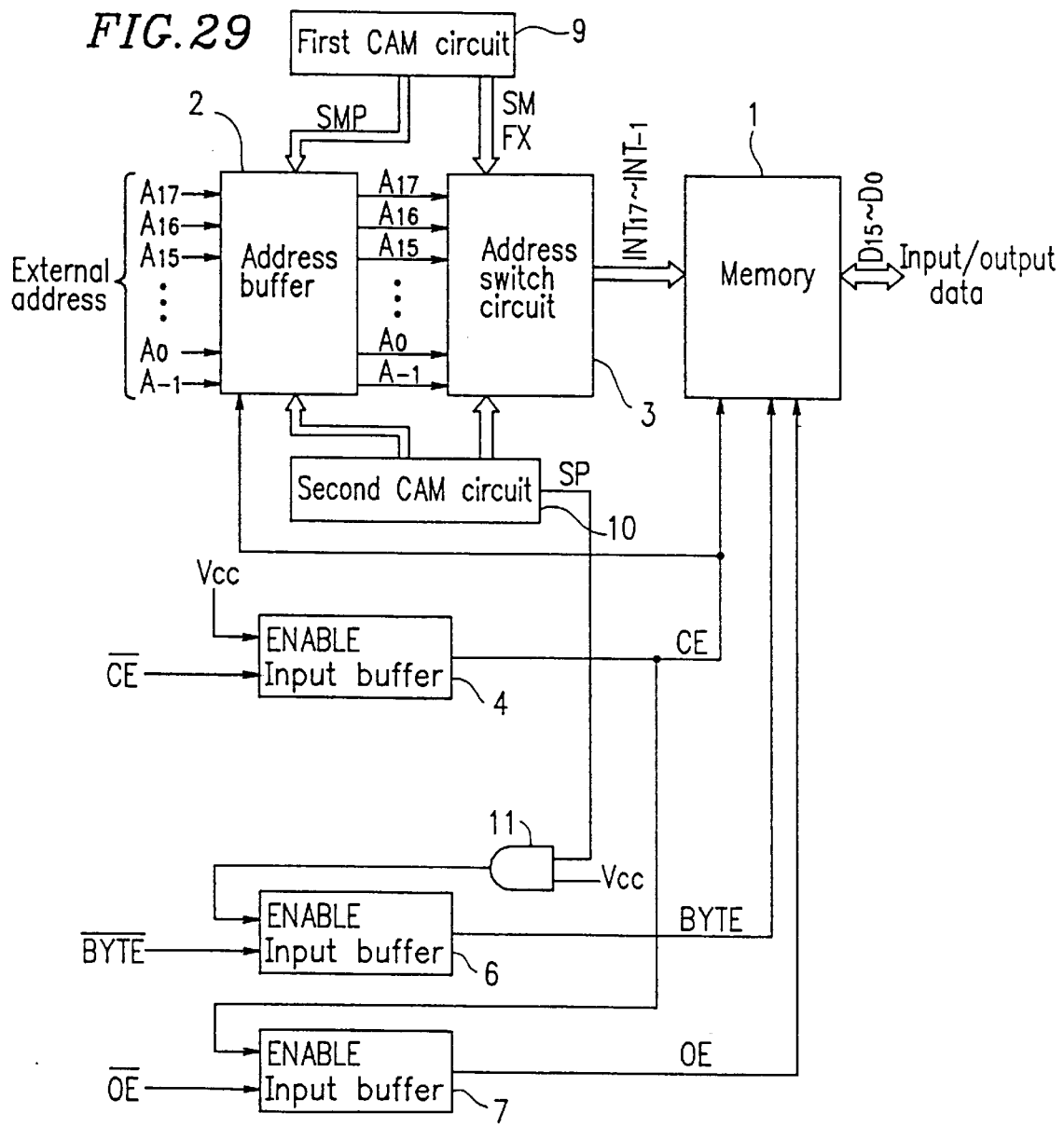
FIG. 29 is a block diagram showing the configuration of a ROM device according to the present invention.

The present invention is also applicable to normal ROMs. A ROM having defective memory cells can be recovered without being discarded if circuitries shown in FIGS. 28 and 29 are used. In the circuitries shown in FIGS. 28 and 29, the input buffer 8 for receiving the write enable signal WE bar is removed from the circuitries shown in FIGS. 1 and 25. The operation of the circuitries shown in FIGS. 28 and 29 is basically the same as that of the circuitry shown in FIG. 1. The description of the operation is therefore omitted.

In the case of DRAMs where an address is multiplexed, the present invention is applicable by arranging the circuitries shown in FIGS. 25 to 27 so that the input buffer 4 receives a signal RAS bar or CAS bar instead of the chip enable signal CE bar.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An electrically rewritable nonvolatile semiconductor memory device, comprising:

CAM data setting means for storing CAM data electrically written therein and determining a region to be invalidated, said CAM data being received from an external source;

address fixing means for locking a signal level of a portion of an internal address into one of two permanent states, the permanent states being either high or low, the portion of the internal address corresponding to an external address input from an external source based on the CAM data set in the CAM data setting means; and address switch means for switching a corresponding relationship between a portion of the external address input from an external source and a portion of the internal address based on the CAM data set in the CAM data setting means.

2. A nonvolatile semiconductor memory device according to claim 1, further comprising signal fixing means for locking a signal level of an internal signal into one of two permanent states, the permanent states being either high or low, the internal signal corresponding to a portion of an external signal input from an external source based on the CAM data set in the CAM data setting means.

3. A nonvolatile semiconductor memory device according to claim 1, further comprising signal switch means for switching a connection between at least a portion of output lines of input buffers for receiving external signals from an external source and at least a portion of internal signal lines based on the CAM data set in the CAM data setting means.

4. A nonvolatile semiconductor memory device according to claim 1, further comprising input buffer disabling means for disabling an input buffer for receiving a portion of an external signal input from an external source based on the CAM data set in the CAM data setting means.

5. A nonvolatile semiconductor memory device according to claim 1, further comprising:
   automatic erase/write control means for conducting erase verification using a count address counted by an address counter; and
   address counter changing means for fixing a signal level of a portion of digits of the address counter and connecting sequentially a more significant digit and a less significant digit of the portion of the digits of which signal level was fixed.

6. A nonvolatile semiconductor memory device according to claim 1, further comprising:
   automatic erase/write control means for conducting erase verification using a count address counted by an address counter;
   count address switch means for switching a corresponding relationship between a portion of a count value output from the address counter and a portion of the count address based on the CAM data set in the CAM data setting means; and
   initial value input means for inputting the external address input from outside into the address counter as an initial value of the count value.

7. A nonvolatile semiconductor memory device according to claim 1, further comprising:
   automatic erase/write control means for conducting erase verification using a count address counted by an address counter;
   count address switch means for switching a corresponding relationship between a portion of a count value output from the address counter and a portion of the count address based on the CAM data set in the CAM data setting means; and
   initial value input means for inputting the internal address into the address counter as an initial value of the count value by inverse transformation of the address switch means.

8. A nonvolatile semiconductor memory device according to claim 1, wherein a memory cell array is divided into erase blocks of a fixed size, and
   the nonvolatile semiconductor memory device further comprises erase block size switch means for switching the size of the erase blocks based on the CAM data set in the CAM data setting means.

9. A nonvolatile semiconductor memory device according to claim 5, further comprising maximum address size switch means for switching a maximum address size of the address counter.

10. A nonvolatile semiconductor memory device according to claim 1, further comprising CAM data read means for reading the CAM data set in the CAM data setting means externally.

11. A semiconductor memory device, comprising:
    CAM data setting means for storing CAM data written therein from an external source and determining a region to be invalidated;
    address fixing means for locking a signal level of a portion of an internal address into one of two permanent states, the permanent states being either high or low, the portion of the internal address corresponding to an external address input from an external source based on the CAM data set in the CAM data setting means; and
    address switch means for switching a corresponding relationship between a portion of the external address input from an external source and a portion of the internal address based on the CAM data set in the CAM data setting means.

12. A semiconductor memory device according to claim 11, further comprising signal fixing means for locking a signal level of an internal signal into one of two permanent states, the permanent states being either high or low, the internal signal corresponding to a portion of an external signal input from an external source based on the CAM data set in the CAM data setting means.

13. A semiconductor memory device according to claim 11, further comprising signal switch means for switching a connection between at least a portion of output lines of input buffers for receiving external signals from an external and at least a portion of internal signal lines based on the CAM data set in the CAM data setting means.

14. A semiconductor memory device according to claim 11, further comprising input buffer disabling means for disabling an input buffer for receiving a portion of an external signal input from an external source based on the CAM data set in the CAM data setting means.

15. A semiconductor memory device according to claim 11, further comprising CAM data read means for reading the CAM data set in the CAM data setting means externally.

16. An electrically rewritable nonvolatile semiconductor memory device, comprising:
    CAM data setting means for storing CAM data electrically written therein and determining a region to be invalidated, said CAM data being received from an external source;
    address fixing means for locking at least one bit of a plurality of bits of an internal address into one of two permanent states based on the CAM data set in the CAM data setting means, the permanent states being either high or low, the internal address corresponding to an address directly supplied to a memory of the semiconductor memory device for accessing a memory cell therein, each of the plurality of bits of the internal address having a corresponding relationship to a respective one of a plurality of bits of an external address supplied to the semiconductor memory device from an external source; and
    address switch means for switching the corresponding relationship between at least a portion of the respective plurality of bits of the internal address and the external address based on the CAM data set in the CAM data setting means.

17. The semiconductor memory device according to claim 16, wherein the at least a portion of the respective plurality of bits corresponds to at least one of three most significant bits of each of the respective plurality of bits of the internal address and the external address.

18. The semiconductor memory device according to claim 16, wherein, in the event the most significant bit of the plurality of bits of the internal address is not at least one of the plurality of bits of the internal address which is locked into one of the two permanent states, the address switch means switches the corresponding relationship between the internal address and external address such that a bit other than the most significant bit of the external address is corresponded to the most significant bit of the internal address.

* * * * *